United States Patent

Miyazawa et al.

[11] Patent Number: 5,646,587
[45] Date of Patent: Jul. 8, 1997

[54] MAGNETIC ELEMENT SWITCH

[75] Inventors: Yasuhiro Miyazawa; Daisuke Takanohashi; Makoto Uda, all of Shizuoka, Japan

[73] Assignee: Yazaki Corporation, Tokyo, Japan

[21] Appl. No.: 556,082

[22] Filed: Nov. 9, 1995

[30] Foreign Application Priority Data

Nov. 10, 1994 [JP] Japan .................. 6-276712
Mar. 2, 1995 [JP] Japan .................. 7-043066
Oct. 26, 1995 [JP] Japan .................. 7-279324

[51] Int. Cl.$^6$ ................................. H01H 9/00
[52] U.S. Cl. ......................... 335/205; 335/207
[58] Field of Search .......................... 335/205.7

[56] References Cited

U.S. PATENT DOCUMENTS 3,800,249  3/1974  Bury ........................ 335/205
5,373,125  12/1994  Ford et al. ................. 200/61

FOREIGN PATENT DOCUMENTS 58-80229   5/1983  Japan .
63-85544   6/1988  Japan .
3-112441  11/1991  Japan .

*Primary Examiner*—Lincoln Donovan
*Attorney, Agent, or Firm*—Sughrue, Mion, Zinn, Macpeak & Seas

[57] ABSTRACT

A magnetic element switch is provided which can reduce the number of parts and the cost of the switch as well as improve the reliability thereof. The magnetic element switch includes an operation part oscillatable about a neutral position when operated by an operator, a magnet oscillatable about a neutral position directly or indirectly due to the oscillation of the operation part, and a magnetic element fixedly disposed adjacent to the magnet for generating an electromotive voltage proportional to the density of a magnetic flux incident thereon. The magnetic element is positioned such that a magnetic force line generated by the magnet at the neutral position is allowed to pass through the magnetic element parallel to an electric field formed with the magnetic element and also such that, when the magnet is oscillated, the magnetic force line is allowed to pass therethrough not parallel to the electric field within the magnetic element. The magnetic element switch is operated based on an electromotive voltage having a plurality of values generated by the magnetic element at a plurality of predetermined oscillation positions of the magnet.

14 Claims, 15 Drawing Sheets

| POSITION OF MAGNET | HALL IC M1 | HALL IC M2 |
|---|---|---|
| A | 0 | 0 |
| B | −1 | 0 |
| C | −1 | −1 |
| D | 0 | −1 |
| E | +1 | −1 |
| F | +1 | 0 |
| G | +1 | +1 |
| H | 0 | +1 |
| I | −1 | +1 |

FIG. 15

| POSITION OF MAGNET | PROPORTION OUTPUT TYPE M1 | PROPORTION OUTPUT TYPE M2 |
|---|---|---|
| A | 0 | 0 |
| B | −k1 | 0 |
| C | −k2 | −k2 |
| D | 0 | −k1 |
| E | +k2 | −k2 |
| F | +k1 | 0 |
| G | −k2 | +k2 |
| H | 0 | +k1 |
| I | −k2 | +k2 |

$0 \leq k2 < k1 \leq 1$

| POSITION OF MAGNET | PROPORTION OUTPUT TYPE M1 | PROPORTION OUTPUT TYPE M2 |
|---|---|---|
| PN | k2 | k2 |
| P1 | 0 | k1 |
| P2 | 0 | k3 |
| P3 | 0 | 0 |
| P4 | k3 | 0 |
| P5 | k1 | 0 |
| P6 | 1 | 0 |
| P7 | k1 | k1 |
| P8 | 0 | 1 |

$0 < k3 < k2 < k1 < 1$

MAGNETIC ELEMENT SWITCH

BACKGROUND OF THE INVENTION

1. Field of the Invention

The present invention relates to a magnetic element switch and, in particular, to a magnetic element switch of a multi-point structure using a magnetic element, which is mounted into an electric equipment system of an automobile or the like.

2. Background

Conventionally, for a switch which is mounted into an electric equipment system to flow or interrupt a current, there has been often used a contact type structure. However, in such a contact type switch, there are drawbacks such as poor contact due to worn contact portions or contaminated surfaces, occurrences of troubles due to broken contact portions, and the like. This is the reason why a non-contact type switch is employed.

As a typical example of such non-contact switch, there is known a non-contact switch using a magnetic element which is disclosed in Japanese Patent Publication No. 58-80229. Describing the structure of this non-contact switch with reference to FIG. 25, there is provided a key top 101 which can be rotated about a rotary shaft 102 clockwise or counterclockwise, and also which includes a leg portion 104 hanging down from the key top 101, while a magnet 105 is disposed in the leading end of the leg portion 104. As the switch is operated by an operator, the magnet 105 is oscillated right and left in FIG. 25.

When the magnet 105 is oscillated left, a line of magnetic force enters a magnetic element 106 which is fixedly provided on the left side, thereby producing an electromotive voltage in the magnetic element 106. On the other hand, no line of magnetic force enters magnetic element 107 which is fixedly provided on the right and, therefore, no electromotive voltage is produced in the magnetic element 107.

Contrary to the above, when the magnet 105 is oscillated right, then the line of magnetic force enters the right magnetic element 107 to thereby produce an electromotive voltage in the magnetic element 107, whereas no line of magnetic force enters the left magnetic element 106 and thus no electromotive voltage is produced in the magnetic element 106. Further, when the key top 101 is situated at a neutral position, then the magnet 105 is also situated at a neutral position, so that no line of magnetic force enters the two magnetic elements 106 and 107 and thus no voltage is produced in the two magnetic elements 106 and 107.

As a result of the voltages produced from the two magnetic elements 106 and 107, the pressing condition of the key top 101 can be specified to perform a switching operation corresponding to the specified pressing condition of the key top 101.

Also, in the magnetic element, after a current is allowed to flow in a semiconductor to thereby produce an electric field E as shown in FIG. 26, if a magnetic flux B enters at right angles to the electric field E, then an electromotive voltage Vg is produced in a direction perpendicular to the electric field E and magnetic flux B. Therefore, if the direction of the magnetic flux B is reversed, then the direction of the electromotive voltage Vg is also reversed. Also, if the electric field E is parallel to the magnetic flux B, then the electromotive voltage V cannot be produced.

As described above, the conventional non-contact type switch using the magnetic elements is able to avoid the drawbacks found in the conventional contact type switch. However, in the conventional non-contact type switch, one magnetic element is provided for each point (the number of contacts). Therefore, especially in the conventional multi-point switch, the number of parts such as amplifiers for amplifying the outputs of the respective magnetic elements, from the number of magnetic elements down, increase, which results in increased cost. Further, because the circuit of the switch cannot be simplified, the reliability of the switch is not adequate.

SUMMARY OF THE INVENTION

The present invention aims at eliminating the problems and drawbacks found in the conventional magnetic element switches. Accordingly, it is an object of the invention to provide a magnetic element switch which can reduce the number of parts, can reduce the cost thereof, and is improved in reliability.

In attaining the above object, according to a first aspect of the invention, there is provided a magnetic element switch which comprises an operation part oscillatable about a neutral position, a magnet oscillatable about a neutral position at least in one direction directly or indirectly due to the oscillation of the operation part, a magnetic element fixedly disposed adjacent to the magnet for generating an electromotive voltage proportional to the density of a magnetic flux incident thereon, the magnetic element disposed at a position where a line of magnetic force generated by the magnet situated at the neutral position is allowed to pass in parallel to an electric field formed within the magnetic element, and the magnet disposed at a position where a line of magnetic force generated by the magnet situated at an arbitrary oscillation position is allowed to pass not parallel to the electric field within the magnetic element. The magnetic element switch can be operated in accordance with an electromotive voltage of two or more values respectively generated at a plurality of predetermined oscillation positions of the magnet by the magnetic element.

Also, according to the first aspect of the invention, the component of the magnetic force line acting on the magnetic element extending at right angles to the electric field within the magnetic element can be reversed in direction with the neutral position as the reversing boundary.

Further, according to the first aspect of the invention, the operation part can be oscillated about the neutral position.

Moreover, according to the first aspect of the invention, the operation part includes a switch knob projected from a case storing the magnetic element therein for performing a moving operation in the right and left direction about the neutral position, and a slider which includes a magnet and, when the switch knob performs the moving operation in the right and left direction from the neutral position, causes the magnet to move in the right and left direction from the magnetic element.

According to a second aspect of the invention, there is provided a magnetic element switch which comprises an operation part oscillatable about a neutral position in an arbitrary direction, a magnet oscillatable about a neutral position directly or indirectly in accordance with the oscillation of the operation part, two magnetic elements respectively disposed adjacent to the magnet and fixed on arbitrary, mutually orthogonal axes for generating electromotive voltages based on the densities of magnetic fluxes incident thereon, and the magnetic elements respectively disposed at positions where a line of magnetic force generated by the magnet situated at the neutral position is allowed to pass parallel to electric fields respectively formed within the two magnetic elements. The present magnetic element switch can be operated based on the electromotive voltages generated by the respective magnetic elements at a plurality of predetermined oscillation positions of the magnet.

Also, according to the second aspect of the invention, the present magnetic element switch may be structured in such a manner that the two magnetic elements are respectively disposed so as to extend over the neutral position.

Further, according to the second aspect of the invention, the present magnetic element switch may be structured in such a manner that at least one of the two magnetic elements is disposed apart from the neutral position.

According to a third aspect of the invention, there is provided a magnetic element switch which comprises an operation part oscillatable about a neutral position in an arbitrary direction, a suspension rod connected continuously with the lower end of the operation part, a non-magnet inductive slider including a hollow portion larger than the thickness of the leading end of the suspension rod and, with the suspension rod loosely fitted into the hollow portion, translatable parallel about a neutral position in accordance with the oscillation of the suspension rod, a magnet disposed in the lower portion of the slider, a non-magnet inductive slide plate on which the slider can slide, and two magnetic elements disposed adjacent to the magnet with the slide plate between them and respectively, fixed on arbitrary, orthogonally intersecting axes for generating electromotive voltages based on the densities of magnetic fluxes incident thereon. The magnetic element switch can be operated based on the electromotive voltages generated by the respective magnetic elements.

Also, according to the third aspect of the invention, the present magnetic element switch can be structured in such a manner that both of the two magnetic element switches are disposed so as to extend over the neutral position.

Further, according to the third aspect of the invention, the present magnetic element switch can be structured in such a manner that at least one of the two magnetic element switches is disposed apart from the neutral position.

According to a fourth aspect of the invention, there is provided a magnetic element switch which comprises an operation part movable horizontally about a neutral position, a pair of slide blocks disposed on the lower surface of the operation part and respectively including mutually opposingly slanting tapered surfaces, energizing device connected continuously with the lower end of the operation part and arranged such that it can energize the tapered surfaces of the slide blocks and can slide on the tapered surfaces in accordance with the horizontal movement of the operation part, a slider connected continuously with the lower end of the operation part and movable horizontally about a neutral position in accordance with the horizontal movement of the operation part, a magnet held by the slider, and a magnetic element fixed adjacent to the magnet for generating an electromotive voltage corresponding to the density of magnetic flux incident thereon.

In the magnetic element switch according to the invention, the operation part is situated at the neutral position when it is not operated by an operator. At the neutral position, the magnetic force line generated by the magnet passes through the magnetic element fixedly disposed adjacent to the magnet but the electric field formed within the magnetic element is parallel to the magnetic force line, so that no voltage can be generated in the magnetic element.

Here, if the operation part is operated by the operator and is thereby oscillated about the neutral position, then the magnet is oscillated about the neutral position at least in one direction directly or indirectly due to the oscillation of the operation part. As a result of this, the magnetic force line is caused to pass through the magnetic element non-parallel to the electric field formed within the magnetic element and thus, in the magnetic element on which the magnetic force line is incident, there is produced a magnetic flux density extending at right angles to the electric field formed within the magnetic element, so that a voltage can be generated in the magnetic element.

The electromotive voltages generated by the magnetic element are different from one another at the respective predetermined oscillation positions of the magnet and, for this reason, a multi-point switching operation is carried out in accordance with the electromotive voltages. Also, due to the oscillation about the neutral position, the component of the magnetic force line incident on the magnetic element extending at right angles to the electric field formed within the magnetic element is reversed in direction with the neutral position as the reversing boundary, so that a switching operation for further multiple points can be realized. Further, if the operator operates the operation part about the neutral position, then the operation part is oscillated about the neutral position to thereby be able to incline the magnet with respect to the neutral position. As a result of this, in operation, the magnetic force line from the magnet can be input at right angles with respect to the electric field formed within the magnetic element, which allows the magnetic element to generate a voltage having a polarity and a magnitude corresponding to the oscillation direction of the operation part. Moreover, if the switch knob is operated and is moved horizontally from its non-operation condition in which it is held at a neutral position, then the magnet is moved in the right and left direction with respect to the magnetic element, and the magnetic force line generated from the magnet is changed in direction with respect to the horizontal electric field in the magnetic element and is thereby input in the perpendicular direction according to the direction of the above right and left direction movements of the magnet, thereby allowing the magnetic element to generate a voltage different in polarity and corresponding to the amount of the movement of the magnet. Therefore, the voltage can be switched in two ways with a single magnetic element according to the moving operation direction of the switch knob.

Also, if the operation part is operated by the operator so that the operation part is oscillated about the neutral position in an arbitrary direction, then, directly or indirectly due to the oscillation of the operation part, the magnet is oscillated about the neutral position in a corresponding direction and in a spherical shape.

As a result of this, when the magnetic force line from the magnet at the oscillation position enters at least one of the two magnetic elements disposed at right angles to each other, the magnetic force line passes through the magnetic element non-parallel to the electric field formed in the magnetic element to thereby generate a magnetic flux density extending at right angles to the electric field, so that there can be generated a voltage in the magnetic element.

Since the electromotive voltages generated by the two magnetic elements are different respectively at a plurality of predetermined oscillation positions of the magnet, a multi-point switching operation can be executed in accordance with the combinations of the electromotive voltages. Further, with use of the magnetic element structured such that it extends over the neutral position, when the magnet is oscillated over the neutral position, then the component of the incident magnetic force line extending at right angles with respect to the electric field formed in the magnetic element is reversed in direction with the neutral position as the reversing boundary, which makes it possible to perform a switching operation for further multiple points.

In another embodiment, if the operation part is operated by the operator such that the suspension rod connected continuously with the lower end of the operation part is oscillated about the neutral position in an arbitrary direction, then the slider is translated parallel along the slide surface of the slide plate due to the oscillation of the suspension rod, while the magnetic force line generated from the magnet provided in the slider enters the two magnetic elements disposed at right angles to each other and passes through them non-parallel to the electric fields formed in the magnetic elements to thereby produce a magnetic flux density extending at right angles to the electric fields, with the result that a voltage is generated in the magnetic elements.

Since the electromotive voltages generated by the two magnetic elements are different respectively at a plurality of predetermined moving positions of the magnet, a multi-point switching operation can be executed in accordance with the combinations of the electromotive voltages. In this manner, a plurality of points can be switched by the two magnetic elements.

According to the invention, if the part is operated by the operator such that it is moved horizontally, then the slider holding a magnet is moved horizontally due to the horizontal movement of the operation part. Responsive to this, the magnetic force line generated from the magnet enters a single magnetic element disposed adjacent to the magnet. Since the position of the magnet is caused to change due to the horizontal movement of the slider, the perpendicular component of the magnetic force line incident on the magnetic element is also caused to change, with the result that a voltage can be generated in the magnetic element.

BRIEF DESCRIPTION OF THE DRAWINGS

FIG. 15 is a table of the magnet positions and the switching type Hall ICs outputs shown in FIG. 11;

DETAILED DESCRIPTION OF THE PREFERRED EMBODIMENTS

A description will be given below of the embodiments of a magnetic element switch according to the invention with reference to the accompanying drawings.

Figure 1:
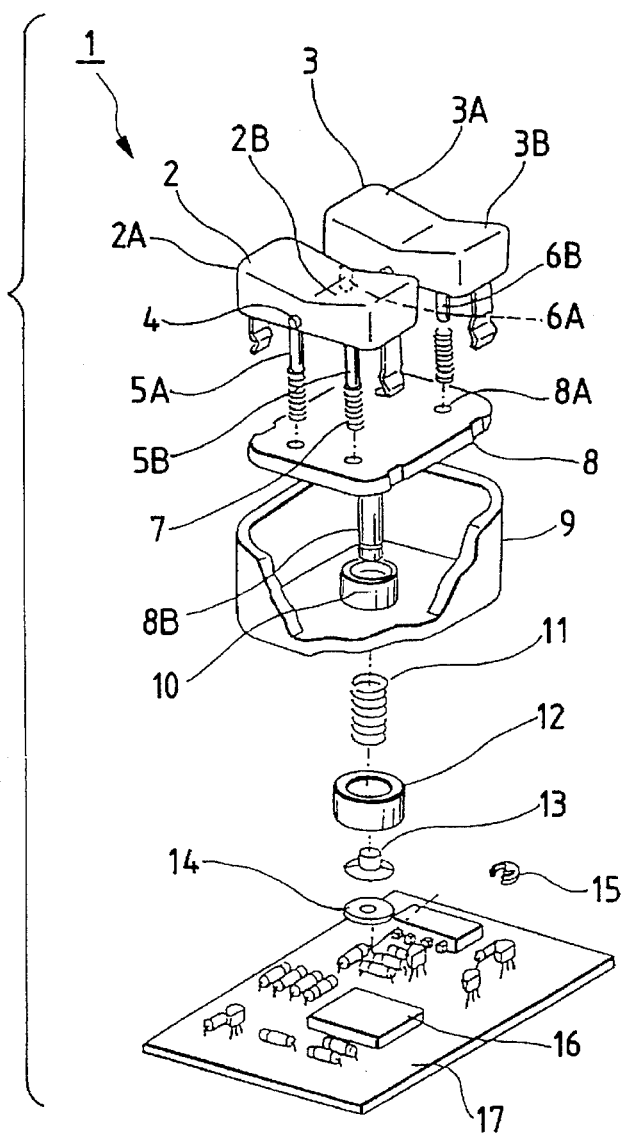
FIG. 1 is an exploded perspective view of the structure of a first embodiment of a magnetic element switch according to the invention.

FIG. 1 is an exploded perspective view of a first embodiment of a magnetic element switch according to the invention.

Figure 2:
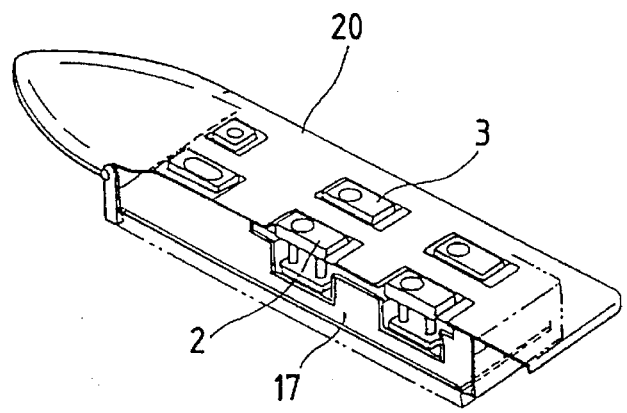
FIG. 2 is a perspective view of the main portions of the magnetic element switch shown in FIG. 1, when it is mounted into a power window case in an automobile.

Also, FIG. 2 is a perspective view of the main portions of an automobile power window case into which the magnetic element switch shown in FIG. 1 is mounted.

In FIG. 1, a magnetic element switch 1 according to the invention includes two key tops (operation parts) 2, 3 respectively oscillatable about a rotary shaft 4 when it is operated by an operator, an oscillatable key support base 8 disposed downwardly of the key tops and including a suspension rod 8b hanging down therefrom, a key support case 9 for storing the key tops 2, 3 and key support base 8 therein, the key support case 9 including an opening 10 into which the suspension rod 8b can be inserted, a compression spring 11 to be fitted with the suspension rod inserted into the opening 10, a bush 12 and a fixing plug 13 respectively to be mounted into the opening 10, and a circuit board 17 including a permanent magnet 14 (which will be hereinafter referred to as a magnet) to be mounted on the leading end of the suspension rod 8b by an E ring 15, the circuit board 17 further including a proportion output type Hall IC 16 disposed adjacent to and in non-contact with the magnet 14.

On the upper surfaces of the two ends of the key top 2 extending at right angles to the rotary shaft 4, there are formed pressure operation surfaces 2A and 2B respectively. Also, on the lower surfaces of the two ends of the key top 2, there are provided long pins 5A and 5B which respectively hang down from the lower surfaces of the key top 2, while compression springs 7, 7 are fitted with the long pins 5A, 5B, respectively. The two long pins 7 are elastically held between the lower end face of the key top 2 and grooves 8A formed in the surface of the key support base 8.

Similarly, on the upper surfaces of the two ends of the key top 3 extending at right angles to the rotary shaft 4, there are formed pressure operation surfaces 3A and 3B respectively. Also, on the lower surfaces of the two ends thereof, there are provided short pins 6A and 6B which respectively hang down from the lower surfaces, while compression springs 7 are fitted with the short pins 6A, 6B, respectively. The two springs 7 are elastically held between the lower end face of the key top 3 and grooves 8A formed in the surface of the key support base 8.

The thus structured magnetic element switch using the proportion output type Hall ICs is mounted into a power window case 20 of an automobile in such a manner that the key tops 2 and 3 are exposed, as shown in FIG. 2.

When not operated by the operator, the key tops 2 and 3 are situated at their neutral positions and, if the operator operates or depresses either of the pressure operation surfaces 2A, 2B or the pressure operation surfaces 3A, 3B, then the key tops are oscillated about their neutral positions. That is, the present magnetic element switch is structured such that the oscillation is transmitted through the pins to the key support base 8 to thereby oscillate the key support base 8 about its neutral position.

Figure 7:
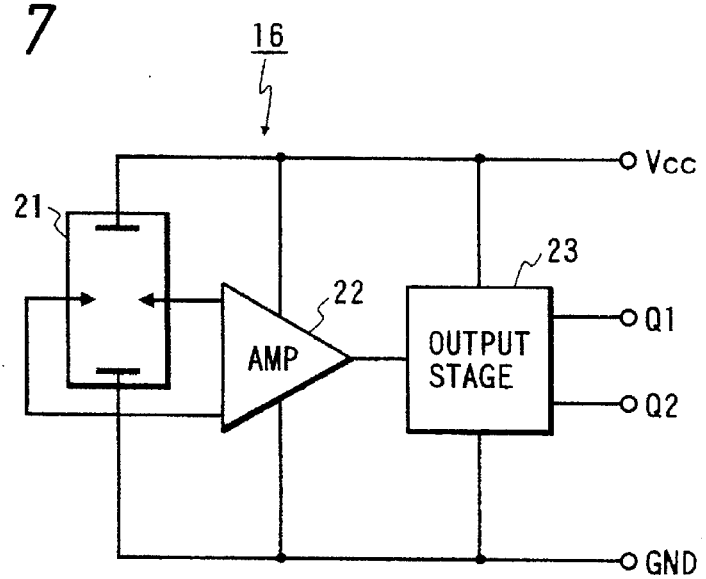
FIG. 7 is a block diagram of a proportion output type Hall IC.
Figure 8:
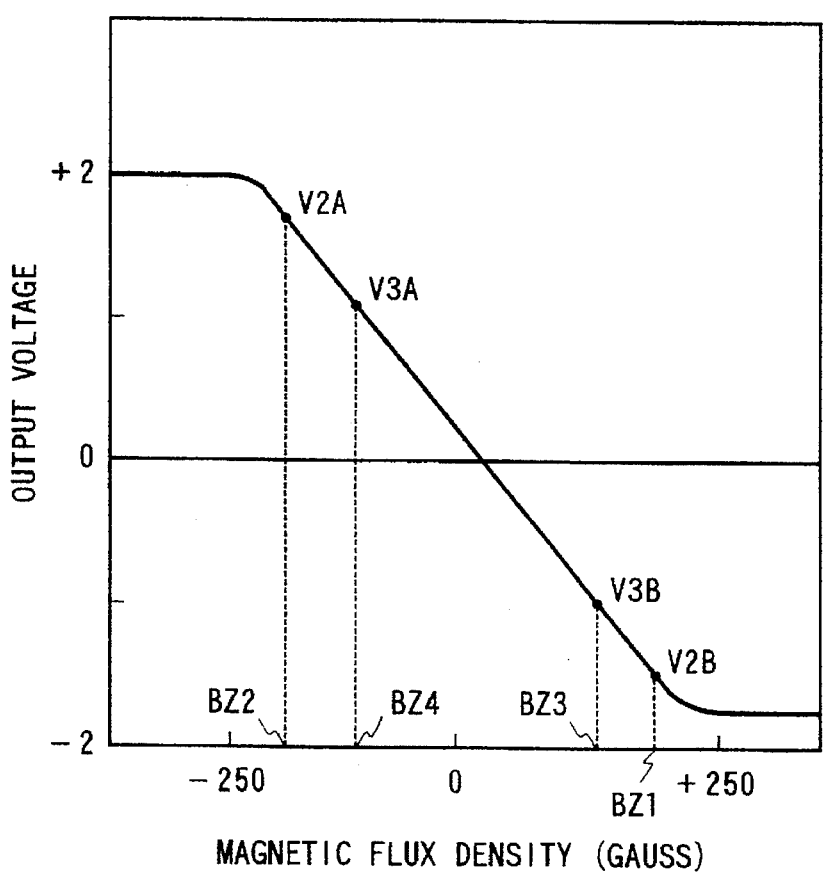
FIG. 8 is a graph of the output voltage characteristics of the proportion output type Hall IC shown in FIG. 7.

Also, the proportion output type Hall IC, as shown in FIG. 7, includes a linear type Hall element 21, an amplifier 22 for amplifying a voltage generated therein, and an output stage 23 for adjusting the polarity of the proportion output of the IC. And, the output voltage characteristic of the Hall IC, as shown in FIG. 8, is proportional to a magnetic flux density, while the voltage polarity is reversed according to the directions of the magnetic flux.

Figure 3:
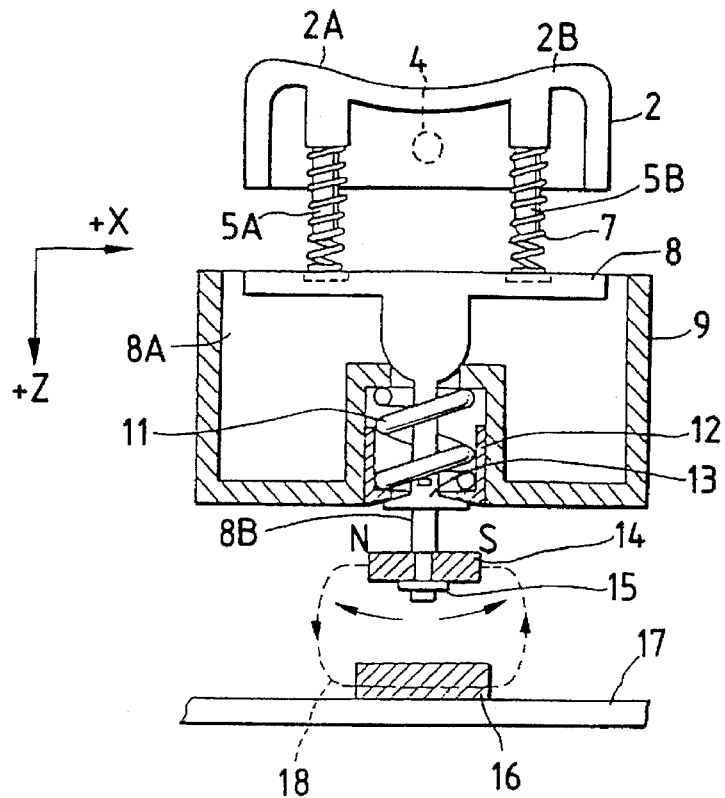
FIG. 3 is an explanatory view of the operation of the magnetic element switch shown in FIG. 1, showing a section view thereof in which a key top is held at its neutral position.
Figure 5:
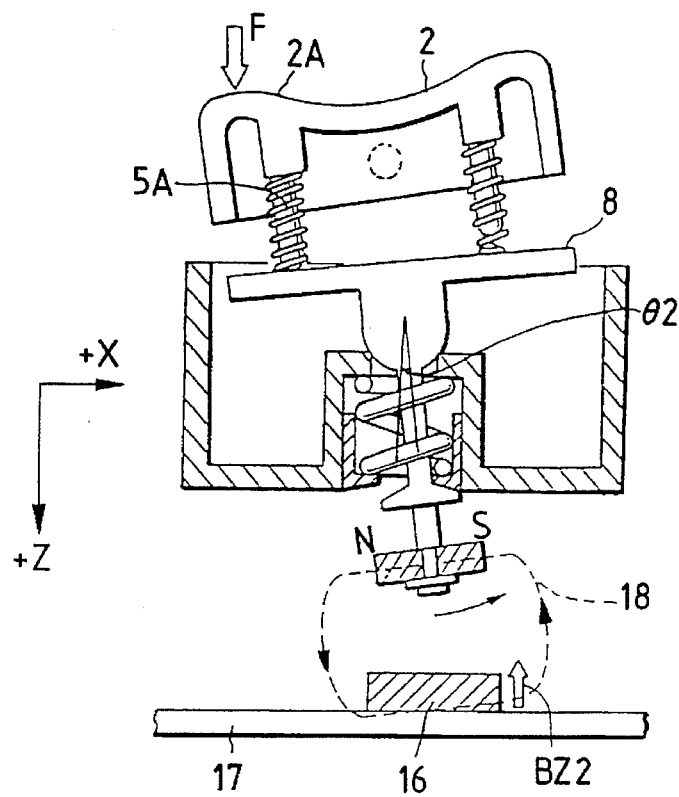
FIG. 5 is an explanatory view of the operation of the magnetic element switch shown in FIG. 1, showing a section view thereof in which a magnet is greatly oscillated right.
Figure 6:
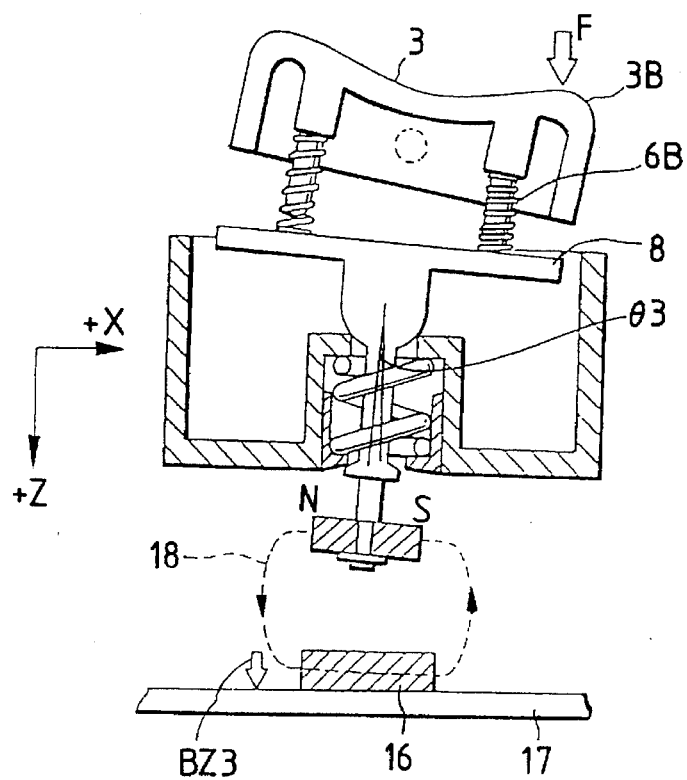
FIG. 6 is an explanatory view of the operation of the magnetic element switch shown in FIG. 1, showing a section view thereof in which a magnet is slightly oscillated left.

FIG. 3 shows the operation of the magnetic element switch 1 and it is a section view of the switch 1 when the key top 2 is set in its neutral position. Also, FIG. 4 similarly shows the operation of the magnetic element switch 1 and it is a section view thereof when the magnet 14 is oscillated greatly in the left (minus X) direction in FIG. 4. Further, FIG. 5 shows the operation of the magnetic element switch 1 and it is a section view thereof when the magnet 14 is oscillated greatly in the right (plus X) direction in FIG. 4. In addition, FIG. 6 is a section view of the magnetic element switch 1 when the magnet 14 is oscillated slightly in the left direction.

Now, description will be given below of the operation of a magnetic element switch according to the invention with reference to FIGS. 3–6.

When not operated by the operator, the key top 2 of the magnetic element switch according to the invention is held at a neutral condition as shown in FIG. 3. That is, the key support base 8 is held horizontally within the key support case 9 by the compression spring 11 not deformed, while the compression springs 7 elastically supported right and left on the upper surface of the key support base 8 push up the two end portions of the key top 2 with substantially equal extension forces, so that the key top 2 can be held substantially horizontally.

At this time, the suspension rod 8B stands vertically and the magnet 14 mounted on the leading end of the suspension rod 8B is situated at its neutral position. A magnetic force line 18 generated from the magnet 14 at the neutral position makes a closed circuit and passes horizontally within the proportion output type Hall IC 16 which is disposed horizontally apart from and in non-contact with the magnet 14 and also in which an electric field is formed in the horizontal direction. That is, within the proportion output type Hall IC 16, the magnetic force line 18 is parallel to the electric field (not shown) and, therefore, no voltage can be generated in the proportion output type Hall IC 16 by the magnetic force line 18. In other words, during the neutral condition of the key top 2, no voltage can be generated from the proportion output type Hall IC 16.

Figure 4:
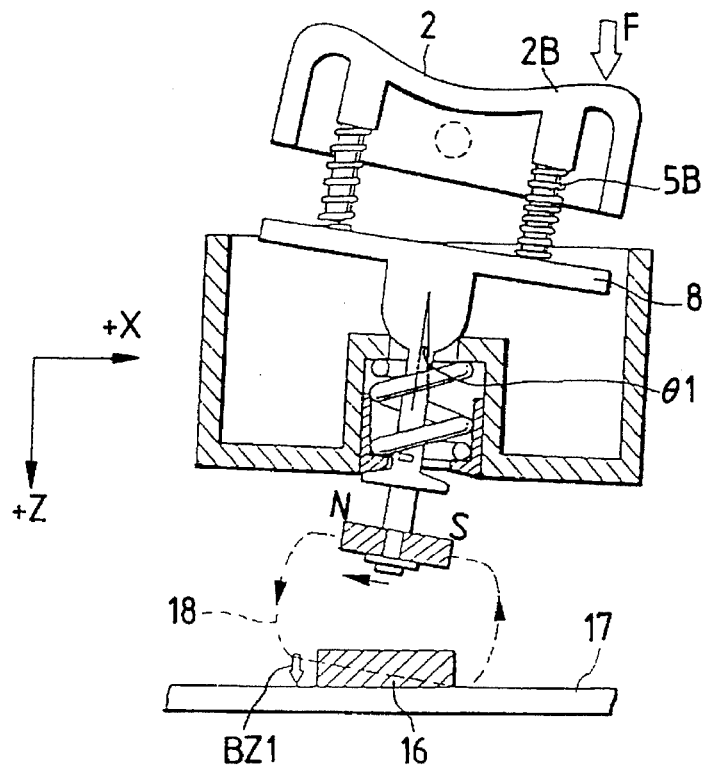
FIG. 4 is an explanatory view of the operation of the magnetic element switch shown in FIG. 1, showing a section view thereof in which a magnet is greatly oscillated left.

Next, if the operator depresses the pressure operation surface 2B with a force F as shown in FIG. 4, then the key top 2 is displaced clockwise in FIG. 4, that is, in the first embodiment of the invention, the key top 2 is oscillated so that the long pin 5B is pressed against the key support base 8 to thereby oscillate the key support base 8 clockwise by an angle of θ1. Due to the oscillation of the key support base 8, the suspension rod 8B is inclined while it deforms the lower end (in FIG. 4, the leading end in the Z direction) of the compression spring 11 connected to the lower end of the suspension rod 8B. Due to the oscillation of the key support base 8, the magnet 14 is oscillated from the neutral position and, at the same time, the magnet 14 is inclined from the horizontal condition, so that the magnetic force line 18 is also inclined from its horizontal condition and is allowed to enter the proportion output type Hall IC 16. As a result of this, the perpendicular component of the magnetic force line forms a magnetic field BZ1 extending in the plus Z direction as shown in FIG. 4 within the proportion output type Hall IC 16. Since the magnetic field BZ1 intersects the electric field at right angles, a voltage is generated in the proportion output type Hall IC 16. The larger the angle θ1, the greater the magnetic field BZ1 and thus the greater the voltage generated.

Next, as shown in FIG. 5, if the operator presses down the pressure operation surface 2A with a force F, then the key top 2 is displaced counterclockwise, that is, oscillated to thereby cause the long pin 5A to be pressed against the key support base 8, so that the key support base 8 is oscillated counterclockwise by an angle of θ2. Because of the oscillation of the key support base 8, the suspension rod 8B is inclined while it deforms the lower end of the compression spring 11 connected to the lower end of the suspension rod 8B. With the oscillation of the key support base 8, the magnet 14 is oscillated from the neutral position in the plus X direction and, at the same time, the magnet 14 is inclined from the horizontal condition, so that the magnetic force line 18 enters the proportion output type Hall IC 16 while it is inclined. The inclination in this case is opposite in direction to the inclination in FIG. 4.

As a result of this, the perpendicular component of the magnetic force line, as shown in FIG. 5, forms a magnetic field BZ2 extending in the minus Z direction within the proportion output type Hall IC 16. Because the magnetic field extends in a direction at right angles to the electric field, a voltage can be generated in the proportion output type Hall IC 16. The present voltage is opposite in direction to the voltage in FIG. 4. And, the larger the angle θ2, the magnetic field BZ2 greater and thus the greater the voltage generated.

Next, as shown in FIG. 6, if the operator presses the pressure operation surface 3B with a force F, then the key top 3 is displaced or oscillated clockwise in FIG. 6. When the oscillation of the key top 3 advances, then the short pin 6B is contacted with the key support base 8 to push the same. As a result of this, the key support base 8 is oscillated clockwise, while an angle of θ3 is smaller than the above-mentioned angle of θ1 because the length of the short pin 6B is shorter than the length of the long pin 5B. That is, even if the key top 3 is oscillated the same amount as the key top 2, the amount of oscillation of the key support base 8 is smaller.

Therefore, the oscillation of the magnet 14 from the neutral position is smaller and the inclination of the magnet 14 from the horizontal condition is smaller, so that a magnetic field BZ3 in the plus Z direction, which is formed in the proportion output type Hall IC 16 by the perpendicular component of the magnetic force line, is also smaller than the magnetic field BZ1, and thus the voltage generated here is also smaller.

Although not shown, when the operator presses down the pressure operation surface 3A with the force F, there are provided similar operations to the above-mentioned case and thus the voltage generated is also small.

Referring to the above results with reference to FIG. 8, in the case of the magnetic flux density in the positive direction, in the magnetic flux density BZ1 in which the oscillation is large due to use of the long pin and the absolute value of the magnetic flux density is large, there is output a voltage V2B in which the absolute value is large and the polarity is negative. Also, in the magnetic flux density BZ3 in which the oscillation is small due to use of the short pin and the absolute value of the magnetic flux density is small, there is output a voltage V3B having a small absolute value and a negative polarity.

On the other hand, in the case of the magnetic flux density in the negative direction, in the magnetic flux density BZ2 in which the oscillation is large due to use of the long pin and the absolute value of the magnetic flux density is large, there is output a voltage V2A in which the absolute value is large and the polarity is positive. Also, in the magnetic flux density BZ4 in which the oscillation is small due to use of the short pin and the absolute value of the magnetic flux density is small, there is output a voltage V3A having a small absolute value and a positive polarity.

In this manner, if a different pressure operation surface is operated, then the voltage is output in such a manner that it has different polarity and absolute value. In other words, a non-contact switch for 4 points can be realized by use of one magnet and one Hall element.

Here, in the structure shown in FIG. 1, the oscillation of the key top oscillates the magnet indirectly through the key support base. However, the invention is not limited to a switch of this structure. It is also possible to employ another structure such that the magnet can be oscillated directly by the oscillation of the key top. What is important is to employ a structure such that the magnet can be moved to a plurality of predetermined oscillation positions according to the operator's operation and, when the magnet is situated at any one of such plurality of oscillation positions, the proportion output type magnetic elements are able to generate different voltages according to the oscillation positions of the magnet.

Figure 9:
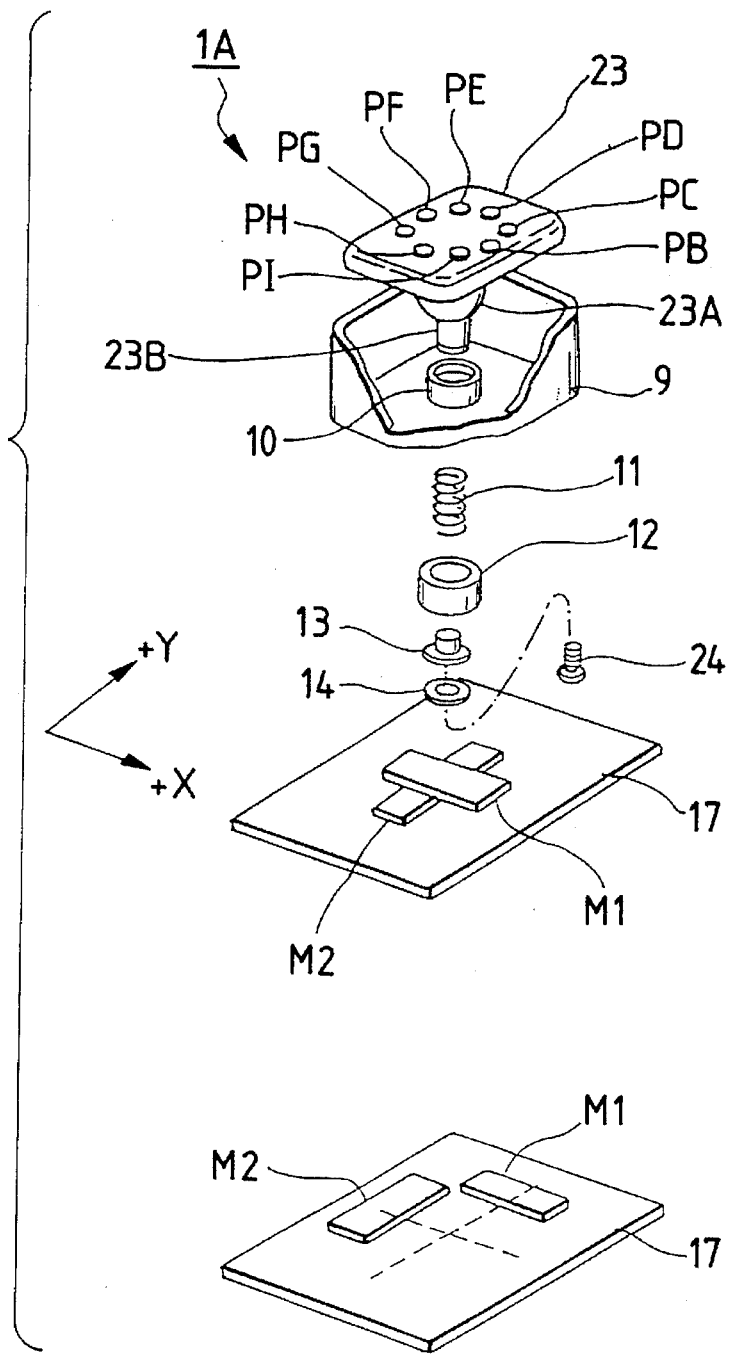
FIG. 9 is an exploded perspective view of the structure of a second embodiment of a magnetic element switch according to the invention.

FIG. 9 is an exploded perspective view of a second embodiment of a magnetic element switch according to the invention. In FIG. 9, a magnetic element switch 1A includes: a key top 23 including on the disk surface thereof 8 pressure operation points arranged radially to be pressed by an operator and, in the central portion of the lower surface thereof, a hemispherical sliding contact portion 23A projecting downwardly and a suspension rod 23B hanging down from the central portion of the hemispherical sliding contact portion 23A; a key support case 9 including in the central portion thereof an opening 10 into which the suspension rod 23B can be inserted and with which the hemispherical sliding contact portion 23A can be slidingly contacted, and being capable of storing the key top 23 in such a manner that the key top 23 can be oscillated in all directions; a compression spring 11 to be fitted with the suspension rod 23B inserted into the opening 10; a bush 12 and a fixing plug 13 respectively to be mounted into the opening 10; and a circuit board 17 including a magnet 14 to be mounted to the leading end of the suspension rod 23B by a screw 24 and further including two Hall ICs (M1 and M2) disposed adjacent to but in non-contact with the magnet 14 on arbitrary orthogonal axes.

Preferably, the two orthogonally intersecting Hall ICs (M1 and M2) may be structured such that both of them extend over a neutral position (to be described later). Alternatively, as shown in the bottom of FIG. 9, the two Hall ICs (M1 and M2) may be disposed on orthogonally intersecting axes but spaced apart from the neutral position, or one of the two Hall ICs (M1 and M2) may be disposed on the orthogonally intersecting axes but spaced apart from the neutral position.

Further, in the above-mentioned structure wherein the two Hall ICs extend over the neutral position, if desired any one of them, for example, M1, may be disposed asymmetric with respect to the neutral position.

Figure 10:
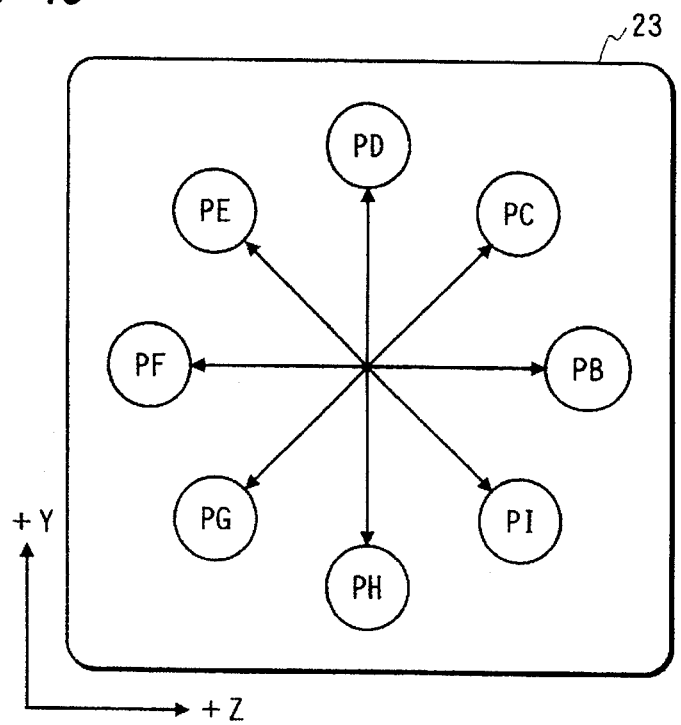
FIG. 10 is a upper plan view of a key top employed in the magnetic element switch shown in FIG. 9.

On the top surface of the key top 23, as shown in FIG. 10, the 8 pressure operation points PB-PI are arranged radially. In operation, any one of the pressure operation points PB-PI is pressed by the operator.

Figure 11:
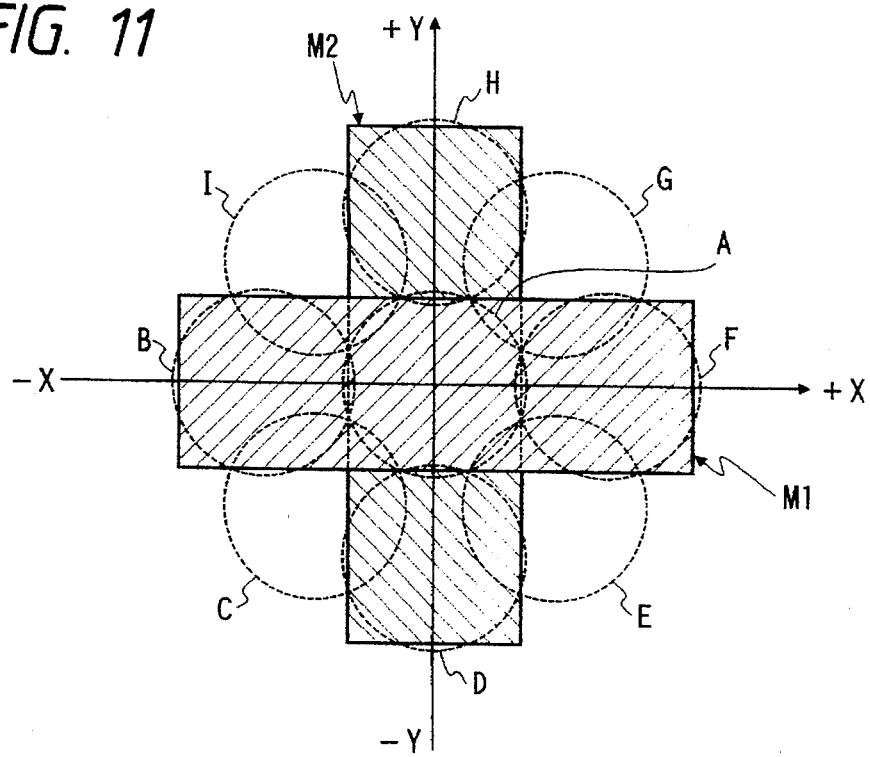
FIG. 11 is an explanatory view of the Hall IC and the moving positions of the magnet included in the magnetic element switch shown in FIG. 9.

Now, when no operation is performed, the key top 23 is held in a horizontal condition. That is, the key top 23 is held horizontally within the key support case 9 by the compression spring 11 that is not deformed. At that time, the suspension rod 23B stands vertical and the magnet 14 mounted to the leading end of the suspension rod 23B is situated at a magnet moving position A shown in FIG. 11. The magnet moving position A provides the neutral position.

A magnetic force line generated from the magnet 14 situated at the neutral position passes horizontally within the two Hall ICs (M1 and M2) which are disposed in non-contact with and spaced apart from the magnet 14 and also in which electric fields are respectively formed in the horizontal direction, thereby forming a closed circuit. That is, since the magnetic force line is parallel to the electric fields within the two Hall IC (M1 and M2), no voltage can be generated at the neutral position in the respective Hall IC (M1 and M2). Therefore, in the neutral condition of the key top 23, no voltage is generated from either of the two Hall ICs (M1 and M2).

Next, in FIG. 10, if the operator presses down the pressure operation point PB, then the key top 23 is oscillated while deforming the compression spring 11 connected to the lower end of the key top 23, thereby causing the leading end of the suspension rod 23B to oscillate in the minus X direction. Responsive to this, the magnet 14 is oscillated along a spherical surface (which does not exist actually) and is thus moved to a magnet moving position B on the minus X axis shown in FIG. 11. At the magnet moving position B, the magnet 14 is inclined and, therefore, the magnetic force line is also inclined as it enters the Hall IC (M2). However, at the magnet moving position B, the magnetic force line does not enter the Hall IC (M2). As a result of this, the perpendicular component of the magnetic force line forms within the Hall IC (M1) a magnetic field which extends in the minus direction orthogonal to the electric field, thereby causing the Hall IC (M1) to generate a negative voltage, whereas no voltage is generated from the Hall IC (M2). Here, the greater the inclination angle of the magnet, the greater the perpendicular component of the magnetic force line and thus the greater the voltage generated.

Next, in FIG. 10, if the operator pressed the pressure operation point PC which is situated in the counterclockwise direction by a distance of a quarter of π from the pressure operation point PB, then the key top 23 is oscillated while deforming the compression spring 11 connected to the lower end of the key top 23, thereby moving the leading end of the suspension rod 23B in the minus X and minus Y directions. As a result of this, the magnet 14 is oscillated along a spherical surface (which does not exist actually) and is moved to a magnet moving position C which is situated between the minus X axis and minus Y axis respectively shown in FIG. 11. At the magnet moving position C, the magnet 14 is inclined and thus the magnetic force line is also inclined as it goes into the Hall IC (M1) and Hall IC (M2). Consequently, the perpendicular component of the magnetic force line forms, within the Hall ICs (M1) and (M2), a magnetic field extending in the minus direction at right angles to the electric field, so that negative voltages can be generated by the two Hall ICs (M1) and (M2) respectively.

Here, the greater the inclination angle of the magnet 14, the greater the perpendicular component of the magnetic force line and thus the greater the voltages generated by the two Hall ICs.

Similarly to the above description, if the pressure operation points PD to PI are pressed down by the operator, then the two Hall ICs (M1) and (M2) are allowed to generate voltages different in polarity and value from one another. Now, in FIG. 12, there are shown output voltages which can be obtained when the two Hall ICs (M1 and M2) are respectively structured by use of a switch-type Hall IC. As can be seen clearly from FIG. 12, according to the magnetic element switch having such structure, a total of 9 points, which includes a subtotal of 8 points of the magnet positions from B to I plus the magnet position A that is the home position of the magnet, can be controlled in accordance with the outputs from the two Hall ICs.

Figures 12, 13:
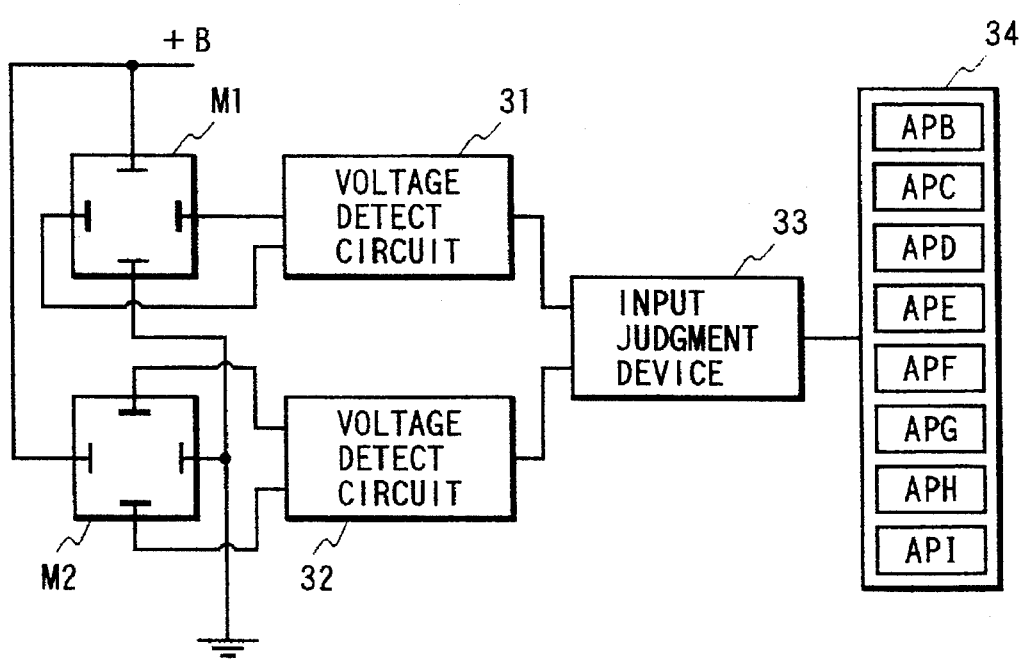
FIG. 12 is a table of the magnet positions and the switching type Hall ICs outputs shown in FIG. 11.
FIG. 13 is a block diagram of a multi-point control unit incorporating a magnetic element switch according to the invention.

Now, in FIG. 13, there is shown a block diagram of a multi-point control unit incorporating therein a magnetic element switch according to the invention which is able to control multiple points.

In FIG. 13, the multi-point control unit comprises a magnetic element switch according to the invention which includes two Hall ICs (M1 and M2) and two voltage detect circuits 31 and 32, input judgment device 33 for receiving an output voltage from the magnetic element switch, and a group of actuators 34 which can be operated based on the judgment results of the input judgment device 33.

Figure 14:
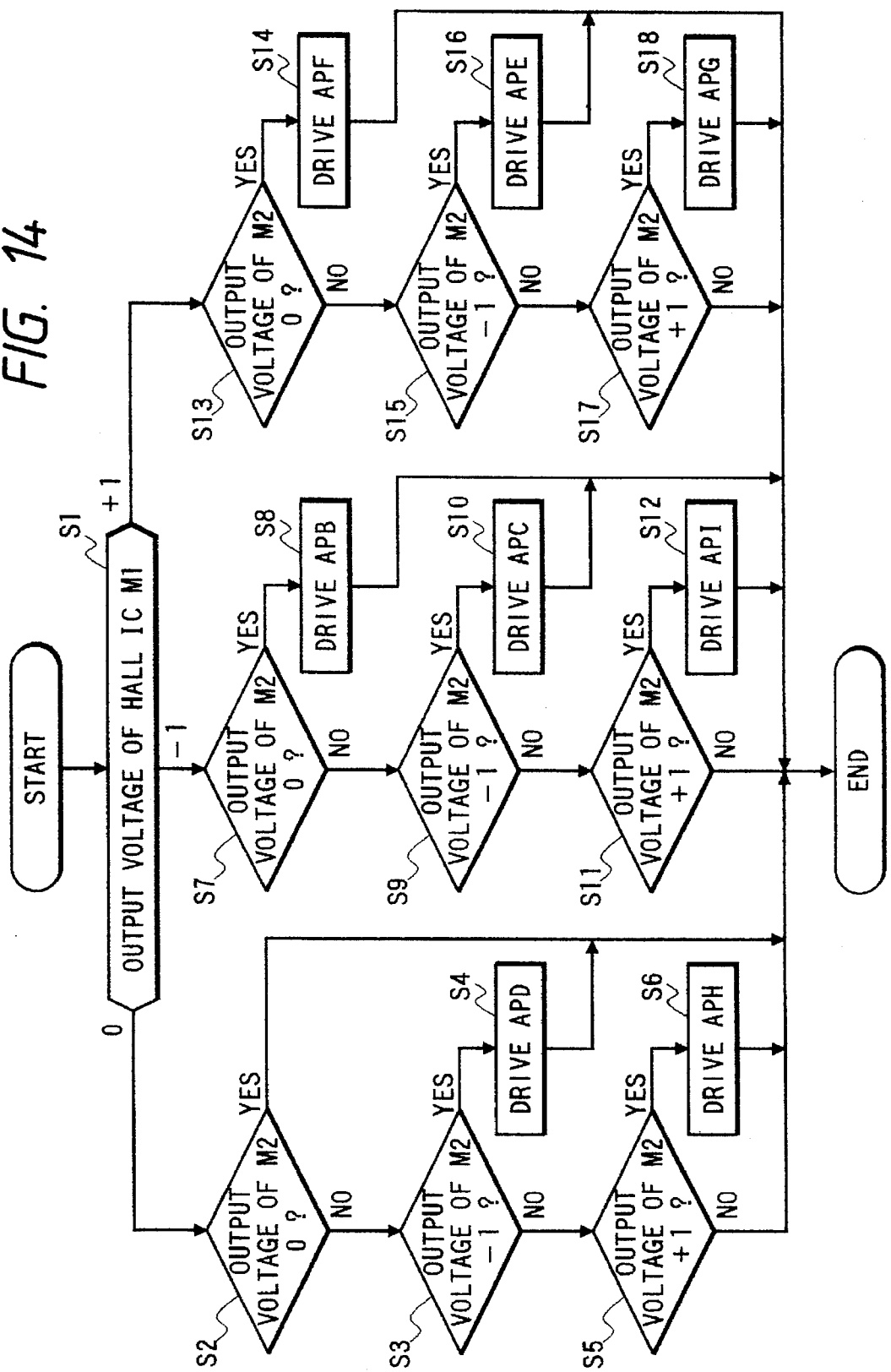
FIG. 14 is a flow chart of the operation of the multi-point control unit shown in FIG. 13.

FIG. 14 is a flow chart of the operation of the multi-point control unit shown in FIG. 13. In the operation of the multi-point control unit, at first, an output voltage from the Hall IC (M1) is confirmed (Step S1) and, if the output voltage is found 0, then an output voltage from the Hall IC (M2) is confirmed (Step S2). If the output voltage is found 0, then it is assumed that the magnet is situated at the magnet position A and no special control is made. If the output voltage from the Hall IC (M2) is not 0 but −1 (Step S3), then an actuator APD is driven (Step S4). If the output voltage is +1 (Step S5), then an actuator APH is driven (Step S6).

Similarly, if the output voltage from the Hall IC (M1) is −1, then in Steps S7 to S12, any one of actuators APB–API is driven. Or, if the output voltage from the Hall IC (M1) is +1, then in Steps S13 to S18, any one of actuators APF–APG is driven.

In the above description, the two Hall ICs (M1 and M2) are both switch-type Hall ICs. On the other hand, in FIG. 15, there are shown the output voltages that are obtained when the two Hall ICs (M1 and M2) are both proportion output type Hall ICs. The output voltages are linear values and, therefore, when the output voltages are normalized, they are output as decimal values.

As can be seen clearly from FIG. 15, according to the magnetic element switch using the proportion output type Hall IC, a total of 9 points, which includes a subtotal of 8 points from the magnet positions B to I plus the magnet position A that is the home position of the magnet, can be controlled based on the outputs of the two Hall ICs.

Also, if a detect circuit is used which can detect the output voltages in terms of linear values with higher precision, then a larger number of points can be controlled for switching. However, in view of various influences such as drift error and the like, in actuality, switching can be reliably performed, if a structure providing a total of 9 points as shown in this specification is employed, switching can be enforced.

In the above description, the 8 pressure operation points are arranged radially on the disk surface of the key top. However, this is not a limitation but, for example, the pressure operation points can be arranged in a 3×3 matrix manner on the surface of a square key top and the center of the surface used as a neutral position.

Figure 16:
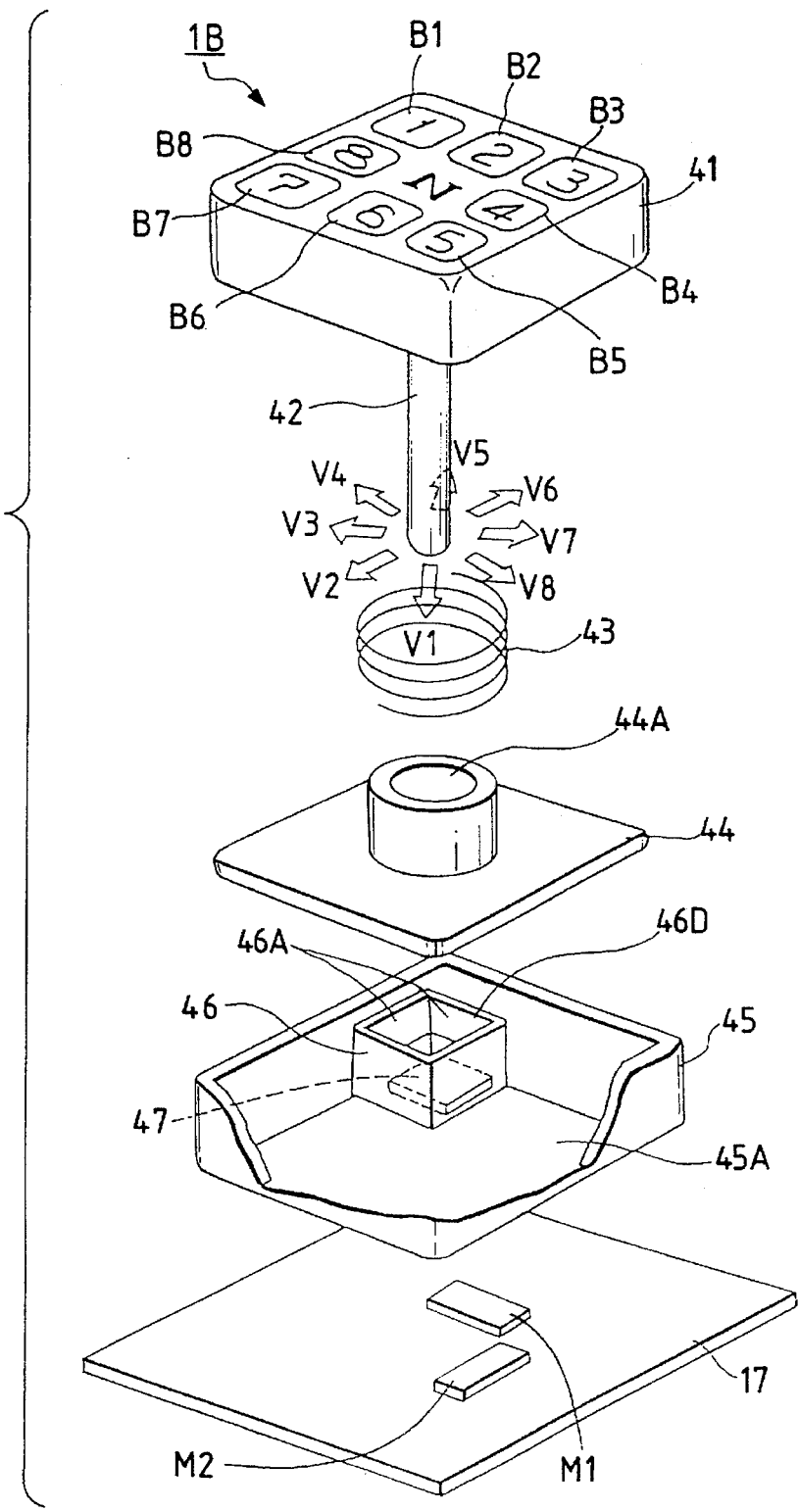
FIG. 16 is an exploded perspective view of a third embodiment of a magnetic element switch according to the invention.

FIG. 16 is an exploded perspective view of a third embodiment of a magnetic element switch according to the invention. In FIG. 16, a magnetic element switch 1B according to the invention comprises: a key top (operation part) 41 including on the top surface thereof 8 pressure operation points B1–B8 to be pressed by an operator, the 8 pressure operation point B1–B8 being arranged in a 3×3 matrix manner with a neutral position N as the center thereof, and also including a suspension rod 42 hanging down from the central portion of the bottom surface thereof, the suspension rod 42 being connected continuously with the bottom surface thereof or being formed integral with the key top 41; and, a key support base 44 including in the central portion thereof an opening 44A into which the suspension rod 42 can be inserted, the key support base 44 being capable of supporting the key top 41 in such a manner that the key top 41 can be oscillated in all directions. Between the lower end of the key top 41 and the upper end of the key support base 44, there is elastically connected a compression spring 43 through which the suspension rod 42 and opening 44A are inserted. The compression spring 43, when no pressure operation point is pressed down by the operator, keeps the key top 41 in the neutral condition to thereby hold the suspension rod 42 at the neutral position. On the other hand, when any one of the operation points is pressed down by the operator and thus the key top 41 and suspension rod 42 are oscillated, the compression spring 43 energizes the key top 41 and suspension rod 42 to thereby return to their respective neutral positions.

Below the key support base 44, there is disposed a freely movable slider 46 which is made of non-magnet inductive material such as resin or the like and is formed in a box with the top portion thereof opened. The slider 46 includes a hollow portion 46D which is larger than the thickness of the leading end of the suspension rod 42 and is opened upwardly, and the suspension rod 42 can be loosely fitted into the hollow portion 46D. That is, in operation, with the suspension rod 42 fitted into the hollow portion 46D loosely, the slider 46 can be moved horizontally due to the oscillation of the suspension rod 42. Also, the respective inner walls of the hollow portion 46D may preferably have tapered portions 46A respectively inclined outwardly in the upper direction of the slider for the purpose of smooth contact with the leading end of the suspension rod 42.

As described above, the slider 46 is structured such that it can convert the oscillatory motions of the key top 41 and suspension rod 42 into horizontal motions.

A magnet 47 is disposed in the lower portion of the slider 46. Alternatively, the magnet 47 may be inserted into a cavity formed in the lower portion of the slider 46, or the magnet 47 may be formed integrally with the slider 46 by embedding the magnet 47 in the slider 46 when the slider 46 is formed. Further, the magnet 47 may be glued to the lower portion of the slider 46.

Moreover, a slide plate 45 formed of non-magnet inductive material such as resin or the like is provided underneath and in contact with the slider 46. The slide plate 45A includes a flat and smooth surface, while the slider 46 can be slided along the flat and smooth surface of the slide plate 45A. For reference, in the present embodiment, the slide plate 45A is formed as the bottom portion of the key support case 45.

Two Hall ICs (M1, M2) are fixedly disposed on a pair of orthogonally intersecting axes such that they are located adjacent to the magnet 47 with the slide plate 45A between them. The respective Hall ICs (M1, M2) are mounted on a circuit board 17 and, in accordance with the density of the magnetic flux that comes from the magnet 47 which is situated at various moving positions, the Hall ICs (M1, M2) generate corresponding electromotive voltages, respectively.

The two Hall ICs (M1 and M2), the longitudinal axes of which intersect each other at right angles, may be preferably disposed apart from the neutral position as will be described later. Alternatively, one of the two Hall ICs (M1 and M2) may be disposed on the orthogonal axis but apart from the neutral position, or the two Hall ICs may be disposed such that they respectively extend over the neutral position, that in is, in a cross-shaped structure.

Further, in the cross-shaped structure, if desired, one of the Hall ICs, for example, M1, may be disposed asymmetrically with respect to the neutral position.

Figure 17:
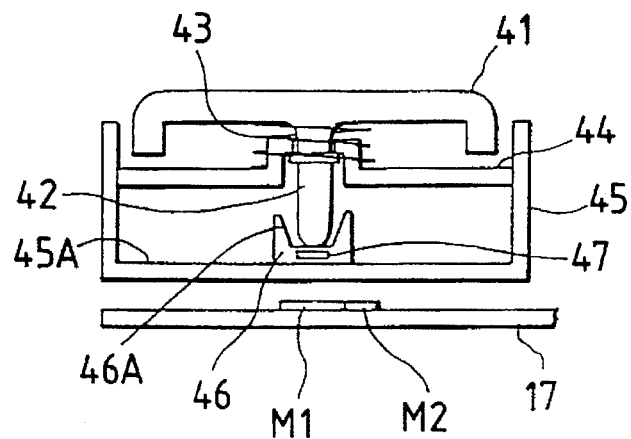
FIG. 17 is a section view of the magnetic element switch shown in FIG. 16.

In FIG. 17, there is shown a section view of the thus structured magnetic element switch 1B.

Figure 18:
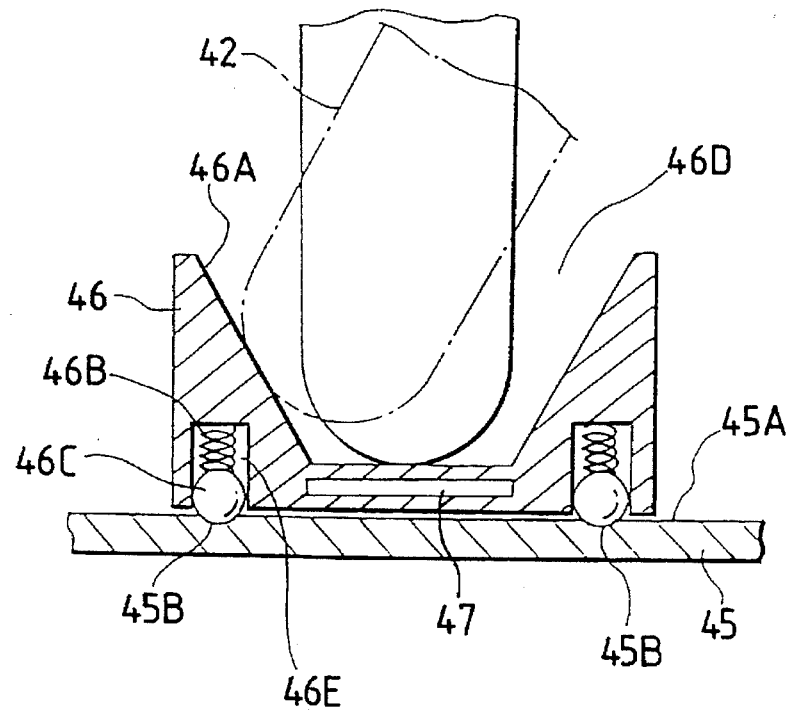
FIG. 18 is a section view of the main portions of an embodiment of a provisional stopper mechanism to be applied to the magnetic element switch shown in FIG. 16.

Here, in order to prevent the inadvertent operation of the magnetic element switch 1B caused by the movement of the slider 46 at the neutral position due to shocks or the like, it is also possible to provide a provisional stopper mechanism. FIG. 18 is a section view of the main portions of an embodiment of such a provisional stopper mechanism, in which a spring 46B and a spherical body 46C are stored in a storage portion 46E in the slider 46. A recessed portion 45B is disposed at the neutralposition of the slide plate 45 and, when the slider 46 is situated at the neutral position, the spherical body 46C is energized by the spring 46B and is fitted into the recessed portion 45B, thereby fixing the slider 46.

Next, regarding the operation of the magnetic element switch 1B, any of the 8 pressure operation points B1–B8 on the top surface of the key top 41 is pressed by the operator.

When no operation is performed by the operator, then the key top 41 is held in the horizontal state. That is, the key top 41 is held horizontally on the key support base 44 by the compression spring 43 which is not deformed. At that time, the suspension rod 42 is vertical and the slider 46 loosely fitted with the leading end of the suspension rod 42 is held at the neutral position.

Figures 19, 20:
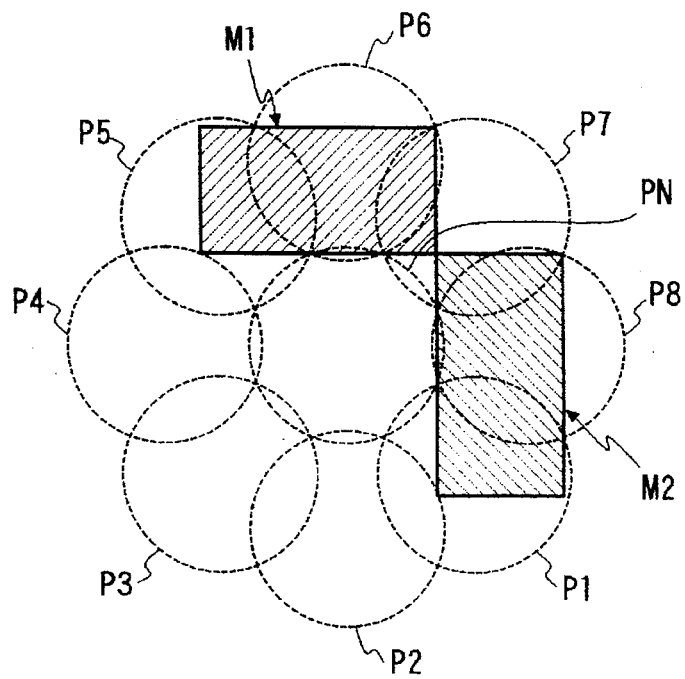
FIG. 19 is an explanatory view of Hall ICs and magnet moving positions in the magnetic element switch shown in FIG. 16.
FIG. 20 is a table of the magnet positions and switching-type Hall ICs outputs in FIG. 19.

The above state corresponds to a magnet position PN shown in FIG. 19. That is, the magnet position PN provides the neutral position of the magnet 47.

A magnetic force line generated from the magnet 47 forms a small closed circuit in which it passes through the two Hall ICs (M1 and M2) which are disposed in non-contact with and apart from the magnet 47 and are arranged horizontally in an L shape. As a result of this, a small voltage is generated within the two Hall ICs (M1 and M2). Therefore, in the neutral condition of the key top 41, a small voltage is generated from both of the two Hall ICs (M1 and M2).

Next, in FIG. 16, if the pressure operation point B1 is pressed down by the operator, then the key top 41 is oscillated while deforming the compression spring 43 elastically connected to the lower end of the key top 41, thereby oscillating the leading end of the suspension rod 42 in a direction V1 shown in FIG. 16. In accordance with the oscillation of the leading end of the suspension rod 42 in the V1 direction, the slider 46 and magnet 47 are respectively moved horizontally on the slide plate 45A, while the magnet 47 reaches a magnet position P1 shown in FIG. 19. A magnetic force line generated from the magnet 47 at the magnet position P1 does not pass through the Hall IC (M1) but does pass through part of the Hall IC (M2). As a result of this, no voltage is generated in the Hall IC (M1) but a mid level voltage is generated in the Hall IC (M2).

Next, if the pressure operation point B2 is pressed down by the operator, then the leading end of the suspension rod 42 is oscillated in direction V2 in FIG. 16 and, in accordance with this oscillation, the slider 46 and magnet 47 are moved horizontally on the slide plate 45A, while the magnet 47 reaches a magnet position P2 shown in FIG. 19. A magnetic force line generated from the magnet 47 at the magnet position P2 does not pass through the Hall IC (M1) at all but, on the other hand, it passes through a small area of the Hall IC (M2). As a result of this, no voltage is generated in the Hall IC (M1), whereas a small voltage is generated in the Hall IC (M2).

Next, if the pressure operation point B3 is pressed by the operator, then the leading end of the suspension rod 42 is oscillated in direction V3 in FIG. 16 and, in accordance with this oscillation, the slider 46 and magnet 47 are both moved horizontally on the slide plate 45A, while the magnet 47 reaches a magnet position P3 shown in FIG. 19. A magnetic force line generated from the magnet 47 at the magnet position P3 does not pass through the two Hall ICs (M1, M2) at all. As a result of this, neither of the Hall ICs (M1, M2) can generate any voltage.

Also, if the pressure operation point B4 is pressed by the operator, then the leading end of the suspension rod 42 is oscillated in direction V4 in FIG. 16. In accordance with this oscillation, the slider 46 and magnet 47 are moved horizontally on the slide plate 45A, while the magnet 47 reaches a magnet position P4 shown in FIG. 19. A magnetic force line generated from the magnet 47 at the magnet position P4 passes through a small area of the Hall IC (M1) but, on the other hand, it does not pass through the Hall IC (M2) at all. As a result of this, a small voltage is generated in the Hall IC (M1) but no voltage is generated in the Hall IC (M2).

Also, if the pressure operation point B5 is pressed by the operator, then the leading end of the suspension rod 42 is oscillated in direction V5 in FIG. 16. In accordance with the oscillation of the leading end of the suspension rod 42 in the V5 direction, the slider 46 and magnet 47 are both moved in the horizontal direction on the slide plate 45A, while the magnet 47 reaches a magnet position P5 shown in FIG. 19. A magnetic force line generated from the magnet 47 at the magnet position P5 passes through part of the Hall IC (M1) but, on the other hand, it does not pass through the Hall IC (M2) at all. As a result of this, mid level is generated in the Hall IC (M1) but no voltage is generated in the Hall IC (M2).

Next, if the pressure operation point B6 is pressed down by the operator, then the leading end of the suspension rod 42 is oscillated in direction V6 in FIG. 16. In accordance with the oscillation of the leading end of the suspension rod 42 in the V6 direction, the slider 46 and magnet 47 are moved horizontally on the slide plate 45A, while the magnet 47 reaches a magnet position P6 shown in FIG. 19. A magnetic force line generated from the magnet 47 at the magnet position P6 passes through a large part of the Hall IC (M1) but, on the other hand, it does not pass through the Hall IC (M2) at all. As a result of this, a large voltage is generated in the Hall IC (M1) but no voltage is generated in the Hall IC (M2).

Next, if the pressure operation point B7 is pressed down by the operator, then the leading end of the suspension rod 42 is oscillated in direction V7 in FIG. 16. In accordance with the oscillation of the leading end of the suspension rod 42 in the V7 direction, the slider 46 and magnet 47 are respectively moved in the horizontal direction along the slide plate 45A, while the magnet 47 arrives at a magnet position P7 shown in FIG. 19. A magnetic force line generated from the magnet 47 at the magnet position P7 is allowed to pass through part of both of the two Hall ICs (M1 and M2). As a result of this, mid level voltage is generated in each of the two Hall ICs (M1 and M2).

Next, if the pressure operation point B8 is depressed by the operator, then the leading end of the suspension rod 42 is caused to oscillate in direction V8 in FIG. 16. In accordance with the oscillation of the leading end of the suspension rod 42 in the V8 direction, the slider 46 and magnet 47 are moved horizontally on the slide plate 45A, while the magnet 47 reaches a magnet position P8 shown in FIG. 19. A magnetic force line generated from the magnet 47 at the magnet position P8 passes through a large part of the Hall IC (M2), but it does not pass through the Hall IC (M1). As a result of this, a large voltage is generated in the Hall IC (M2), whereas no voltage is generated in the Hall IC (M1).

In FIG. 20, there are shown output voltages obtained when each of the two Hall ICs (M1 and M2) is a proportion output type Hall IC. The output voltages are linear values and thus, when the output voltages are normalized, they are output as decimal values.

As can be seen clearly from FIG. 20, according to the magnetic element switch using a proportion output type Hall IC, a total of 9 points including a subtotal of 8 points, that is, the magnet position P1 to the magnet position P8, plus the magnet position PN serving as the home position can be controlled in accordance with the output voltages from two Hall ICs.

Further, a multi-point control unit incorporating the above-mentioned magnetic element switch according to the present embodiment can be realized similarly with a block configuration as shown in FIG. 13.

Figure 21:
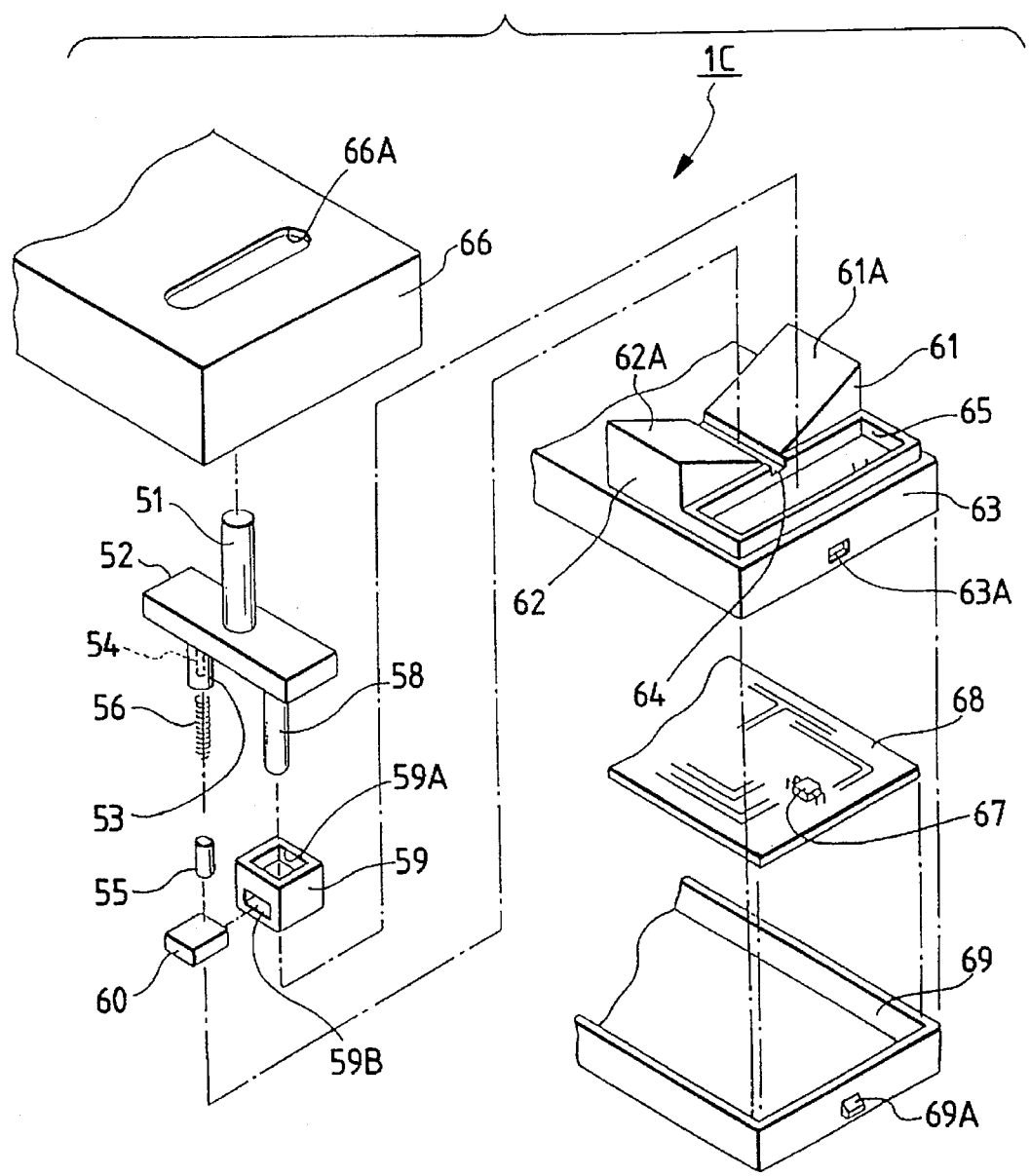
FIG. 21 is an exploded perspective view of the structure of a fourth embodiment of a magnetic element switch according to the invention.

FIG. 21 is an exploded perspective view of a fourth embodiment of a magnetic element switch according to the invention. In FIG. 21, according to the magnetic element switch IC of the present embodiment, the operation part thereof is moved horizontally, whereas according to the first to third embodiments the operation part thereof oscillated.

A key top 51 serving as the operation part is formed of synthetic resin or the like and is mounted integrally on the central portion of the upper surface of a mounting plate 52 which is similarly formed of synthetic resin or the like. Or, the key top 51 may be produced separately from the mounting plate 52 and, after then, it may be connected to or erected on the mounting plate 52. On the lower surface of the mounting plate 52, there is mounted the upper end face of a short tube 53.

Into the short tube 53, there is inserted a pin 54 coaxial with the short tube 53. The upper end of the pin 54 is mounted on the lower surface of the mounting plate 52. The pin 54 is formed shorter than the short tube 53.

Figure 22:
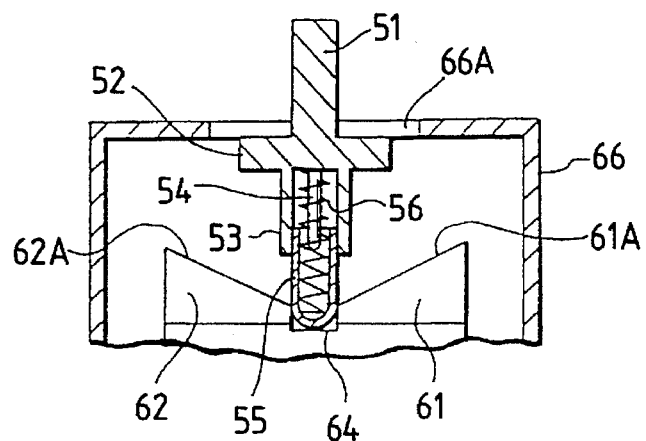
FIG. 22 is a section view of the main portions of the magnetic element switch shown in FIG. 21, showing the operation of a slide knob employed in the present magnetic element switch.
Figure 23:
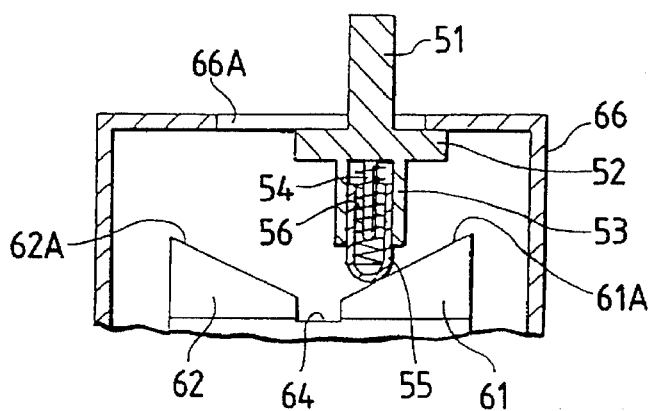
FIG. 23 is a section view of the main portions of the magnetic element switch shown in FIG. 21, showing the operation of a slide knob employed in the present magnetic element switch.

A sliding bottom part 55 is inserted into the lower end portion of the short tube 53. As shown in FIGS. 22 and 23, the sliding bottom part 55 is formed in a tubular shape with a bottom having a U-shaped section, and the bottom portion of the sliding bottom part 55 is formed in a hemispherical shape so that the sliding bottom part 55 can slide easily on the upper surface of a slide block to be described later.

A compression spring 56 is inserted into the short tube 53, while the pin 54 is inserted into the compression spring 56. That is, the pin 54, compression spring 56 and short tube 53 are coaxial with one another. Further, the sliding bottom part 55 can be moved in the vertical direction within the short tube 53 against the elastic force of the compression spring 56.

The pin 54, compression spring 56, short tube 53 and sliding bottom part 55 cooperate together in forming energizing device.

On the lower surface of the mounting plate 52, there is provided a suspension rod 58 in such a manner that it hangs down from the lower surface of the mounting plate 52 at a given distance from the pin 54. The lower end portion of the suspension rod 58 is inserted into a slider 59 from a pin insertion hole 59A formed in the open upper surface of the slider 59 which is formed of non-magnetic material in a hollow cubic shape, and is fixed to the inner wall surface of the slider 59 by adhesives or the like.

In the side surface of the slider 59 situated adjacent to the bottom portion thereof, there is formed a magnet insertion window 59B. A magnet 60 is inserted into the slider 59 from the magnet insertion window 59B and is fixed to the bottom portion of the slider 59 by adhesion or by forming it integral with the slider 59.

The short tube 53 slides on the tapered surfaces 61A and 62A of slide blocks 61 and 62 respectively formed on the upper surface of an inner case 63 which is formed in a shallow dish or in a shallow rectangular shape. The slide blocks 61 and 62 are respectively formed in a triangular pyramid and include the tapered surfaces 61A and 62A which are respectively inclined from their respective vertical angles toward their respective bottom surfaces in a descending direction. In the mutually adjoining portions of the bottom portions of the tapered surfaces 61A and 62A, there is formed a groove 64. In other words, the slide blocks 61 and 62 are formed symmetrically with respect to the groove 64. Further, in the upper surface of the inner case 63, there is formed a slider insertion hole 65 which is located adjacent to the bottom surfaces of the slide blocks 61 and 62 and into which the slider 59 can be inserted.

In order to allow the sliding bottom part 55 to slide on the tapered surfaces 61A and 61B of the slide blocks 61 and 62 as well as to hold the sliding bottom part 55 securely, an outer case 66 is put on the inner case 63 from the upper surface thereof.

The outer case 66 is formed in a rectangular parallelepiped with the bottom surface thereof opened and includes a securing hole (not shown) in the rear wall thereof, while a securing projection (not shown) formed in the rear wall of the inner case 63 is secured to the securing hole of the outer case 66, whereby the outer case 66 can be fixed to the inner case 63.

In the upper surface of the outer case 66, there is formed an elongated guide hole 66A through which the key top 51 can be projected.

The slider 59, which is suspended down through the suspension rod 58 into the outer case 66, faces a proportion output type Hall IC 67. The proportion output type Hall IC 67 is similar in structure to the Hall IC, shown in FIG. 7 and has been previously described with reference to the first embodiment, and the Hall IC 67 is mounted on a circuit board 68.

The circuit board 68 with the proportion output type Hall IC 67 mounted thereon is mounted onto the bottom surface of a lower case 69 formed in a shallow dish shape.

The inner case 63 is mounted over the upper surface of the lower case 69 with the circuit board 68 mounted thereon. In this mounting state, a lock claw 69A provided in the substantially central portion of the front wall of the lower case 69 is secured to a securing hole 63A formed in the substantially central portion of the front wall of the inner case 63 and thus the inner case 63 can be fixed to the lower case 69 by the lock claw 69A.

In the magnetic element switch having the above structure, in the neutral condition thereof in which the sliding bottom part 55 forming the energizing device is fitted into the groove 64, the key top 51 projects upwardly of the upper surface of the outer case 66 through the guide hole 66A, the slider 59 is suspended into the inner case 63 through the suspension rod 58, and the proportion output type Hall IC 67 within the lower case 69 faces the magnet 60 within the slider 59 at a given distance. And, if the key top 51 is moved in the right and left direction by an external operation, then the positional relationship between the proportion output type Hall IC 67 and magnet 60 is changed.

FIGS. 22 and 23 show the operation of the key top 51.

As shown in FIG. 22, since the compression spring 56 stored in the short tube 53 is biasing the sliding bottom part 55 downward, the sliding bottom part 55 can be kept in engagement with the groove 64. Therefore, the key top 51 connected to the short tube 53 remains the neutral position.

On the other hand, as shown in FIG. 23, if the operator operates or slides the key top 51 as shown in FIG. 23, then the sliding bottom part 55 is disconnected from the groove 64 and is moved up along the tapered surfaces 61A and 62A of the slide blocks 61 and 62.

The condition shown in FIG. 23 continues while the operator is applying a force to the key top 51 and, if the operator removes the force from the key top 51, then the sliding bottom part 55 return to the groove 64 and the key top 51 is returns back to the neutral position.

Now a description will be given of the operation of the magnetic element switch 1C according to the fourth embodiment.

When the key top 51 is situated at the neutral position (see FIG. 22), the magnet 60 mounted to the slider 59 is opposed to the proportion output type Hall IC 67.

As has been previously described with reference to FIG. 3, in the neutral condition in which the magnet 60 and the proportion output type Hall IC 67 are opposed to each other, a magnetic force line generated from the magnet 60 enters the proportion output type Hall IC 67 in which an electric field is formed in the horizontal direction. After entry into the Hall IC 67, the magnetic force line runs parallel to the electric field formed within the proportion output type Hall IC 67. In this case, since the perpendicular component of the magnetic force line intersecting orthogonally to the electric field does not exist the output voltage from the proportion output type Hall IC 67 is 0.

Next, if the operator operates or slides the key top 51 and the key top 51 is thereby held at a right or left position (see FIG. 23), then the magnet 60 mounted in the slider 59 and the proportion output type Hall IC 67 are opposed to each other but are shifted from each other to the right or left with respect to the central line thereof.

A magnetic force line generated from the magnet 60 situated to the right or left with respect to the central line enters the proportion output type Hall IC 67 situated on the central line. After entry, the magnetic force line has a given angle of inclination with respect to the electric field formed within the proportion output type Hall IC 67. In this case, since the perpendicular component of the magnetic force line intersecting perpendicularly to the electric field exists, there is generated from the proportion output type Hall IC 67 an output voltage which corresponds to the amount of the perpendicular component of the magnetic force line.

As shown in FIG. 8 which has been described previously, according to the characteristic of the output voltage of the proportion output type Hall IC 67, a positive or negative proportion voltage can be obtained in proportion to the positions of the key top 51 in the right and left direction and the amount of displacement.

Figure 24A:
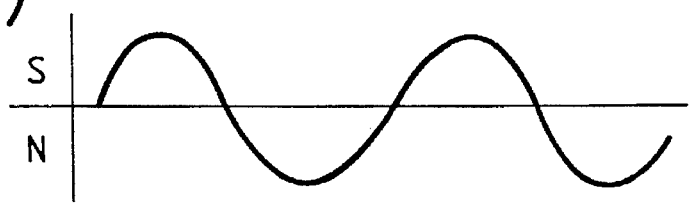
FIGS. 24(a) and 24(b) are waveform charts of the output voltage of a Hall IC that can be applied to a magnetic element switch according to the invention.
Figure 24B:
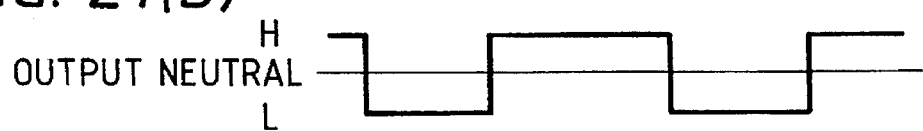
Figure 25:
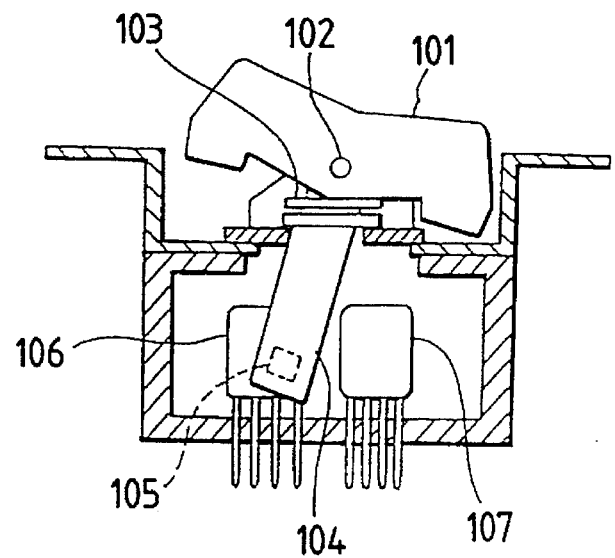
FIG. 25 is a section view of a conventional magnetic element switch.
Figure 26:
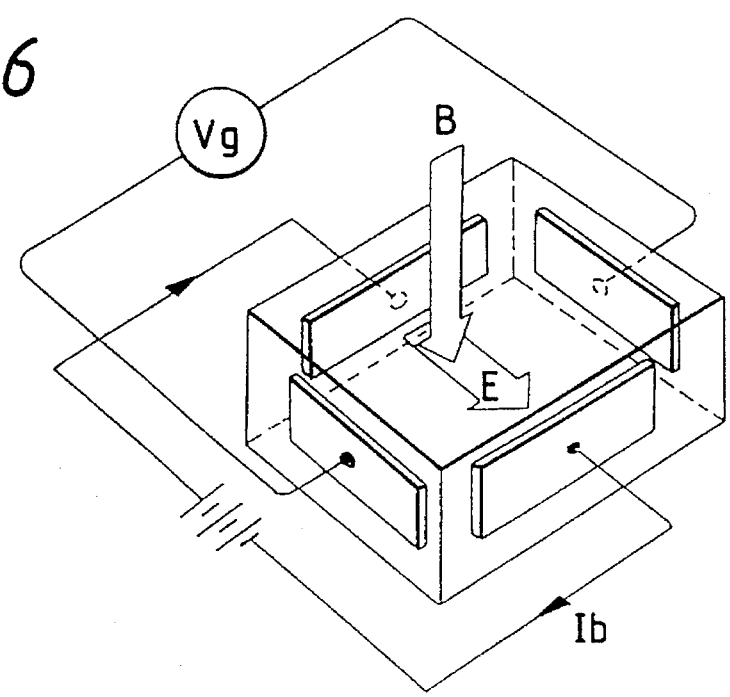
FIG. 26 is an explanatory view of the principles of a Hall IC.

In this specification, the magnetic element switch according to the invention has been described with reference to the embodiments thereof using a proportion output type Hall IC of a type that can generate an analog output voltage. However, according to the invention, it is also possible to employ another structure in which, only when the perpendicular component of a magnetic force line entering a Hall IC (see FIG. 24(a)) is higher than a given level, there can be output a digital output (see FIG. 24(b)) providing a high (H) level or a low (L) level.

As has been described heretofore, according to the first aspect of the invention, the magnetic element switch comprises: a key top arranged such that, when any one of the operation surfaces of the key top is depressed, one of pins different in length correspondingly to the respective operation surfaces presses down and rotates a key support base; a magnet which is mounted on the lower end of a suspension rod of the key support base and, as the suspension rod is inclined, is oscillated and displaced from the neutral position; and, a magnetic element into which a magnetic force line from the magnet is allowed to move. Thanks to this structure, a magnetic force line, which is parallel to a surface perpendicular to the suspension rod at the neutral position, becomes not parallel to the perpendicular surface to thereby generate a component perpendicular to the surface, with the result that a voltage is generated in the magnetic element.

Here, since the magnetic element generates a voltage having a direction and a magnitude which depend on the oscillation positions of the magnet, by changing the direction and angle of rotation of the key top to a plurality of points, a multi-point switch can be realized by use of a single magnetic element, so that the cost of the switch can be reduced and the circuits thereof can be simplified.

According to the second aspect of the invention, the magnetic element switch comprises: a key top structured such that, when one of a large number of pressure operation points of the key top is depressed, a suspension rod is oscillated in a solid angle direction corresponding to the depressed operation point; a magnet oscillatable and displaceable from the neutral position; and two magnetic elements which are disposed intersecting perpendicularly to each other and into which a magnetic force line from the magnet is allowed to move. Due to this structure, a magnetic force line, which is parallel to a surface perpendicular to the suspension rod at the neutral position, becomes not parallel to the perpendicular surface, thereby generating a component of the magnetic force line perpendicular to the surface, causing the two magnetic elements to generate voltages respectively.

Here, the two magnetic elements respectively generate voltages each having a direction and a magnitude which depend on the oscillation positions of the magnet and, therefore, by adapting the respective pressure operation points of the key top to the respective points, a multi-point switch can be realized by use of the two magnetic elements, thereby reducing the cost of the switch as well as simplifing the circuits thereof.

According to the third aspect of the invention, the magnetic element switch comprises: a key top structured such that, when one of a large number of pressure operation points of the key top is depressed, a suspension rod is oscillated in a solid angle direction corresponding to the depressed operation point; a slider movable horizontally due to the oscillation of the lower end of the suspension rod; a magnet mounted on the lower end of the slider; and two magnetic elements which are disposed intersecting perpendicularly to each other and into which a magnetic force line from the magnet is allowed to move. Thanks to this structure, at the moving positions of the magnet, there are generated in the respective magnetic elements voltages, each of which has a magnitude depending on the moving positions of the magnet. Therefore, by correlating the respective pressure operation points of the key top to the respective moving positions of the magnet, a multi-point switch can be realized using the two magnetic elements, so that not only positive operation of the switch but also reduced cost and simplified circuitry can be realized at a stroke. Additionally, in a structure in which the oscillatory motion of the magnet due to the oscillation of the suspension rod is converted into parallel motion, by shortening the distance between the oscillating magnet and the magnetic elements substantially, voltages to be generated from the magnetic elements can be increased to thereby prevent switching malfunctions completely.

According to the fourth aspect of the invention, the magnetic element switch comprises: an operation part movable horizontally about a neutral position; a pair of slide blocks disposed on the lower surface of the operation part and respectively including mutually opposing inclined tapered surfaces; energizing device connected continuously with the lower end of the operation part for energizing the tapered surface of the slide blocks and for sliding along the tapered surfaces due to the horizontal movement of the operation part; a slider connected continuously with the lower end of the operation part and movable horizontally about the neutral position due to the horizontal movement of the operation part; a magnet held by the slider; and a magnetic element fixed adjacent to the magnet for generating an electromotive force corresponding to the incident magnetic flux density. Thanks to this structure, if the key top or the operation part is moved in the horizontal direction, the magnet is also moved in the horizontal direction, whereby there is generated from the magnetic element an output voltage which corresponds to the moving positions of the magnet.

Here, due to the fact that the magnetic element generates a voltage having a direction and a magnitude which depends on the moving positions of the magnet, if the amount of movement of the key top is made to correspond to a plurality of points, then a multi-point switch can be realized using a single magnetic element, so that the cost of the switch can be reduced and the circuits of the switch can be simplified.

What is claimed is:

1. A switch, comprising:

an operation part which oscillates about a neutral position thereof;

a magnet attached to said operation part to oscillate with said operation part; and a magnetic element disposed adjacent to said magnet for generating an electromotive voltage proportional to a magnetic flux density from said magnet, said magnetic element positioned so that (a) a magnetic force line generated by said magnet when said magnet is situated at the neutral position passes through said magnetic element in parallel with an electric field formed within said magnetic element, and (b) said magnetic force line passes through said magnetic element to have a component perpendicular with said electric field when said magnet is oscillated to reach a first position and a second position on opposite sides of said neutral position, thereby changing said electromotive voltage in accordance with the position of said magnet.

2. The switch of claim 1, wherein a component of the magnetic force line perpendicular to the electric field is reversible in direction with the neutral position as the reversing boundary thereof.

3. A switch, comprising:

an operation part which oscillates about a neutral position thereof;

a magnet attached to said operation part to oscillate with said operation part; and two magnetic elements disposed adjacent to said magnet and respectively mounted on perpendicularly intersecting axes for generating electromotive voltages based on a magnetic flux density from said magnet, said magnetic elements positioned so that (a) a magnetic force line generated by said magnet situated at the neutral position passes through said magnetic elements in parallel with electric fields formed within said magnetic elements, respectively, and (b) said magnetic elements positioned where said magnetic force line passes through said magnetic elements to have a component perpendicular with said electric fields when said magnet is oscillated to reach a first position and a second position on opposite sides of said neutral position, thereby changing said electromotive voltages in accordance with the position of said magnet.

4. The switch of claim 3, wherein both of said magnetic elements are disposed so as to extend over the neutral position of said magnet.

5. The switch of claim 3, wherein at least one of said magnetic elements is disposed apart from the neutral position of said magnet.

6. A switch, comprising:

an operation part which oscillates about a neutral position thereof;

a suspension rod continuously formed with a lower end of said operation part;

a slider including a hollow portion engaging with an end portion of said suspension rod, said slider movable horizontally about a neutral position thereof by the oscillation of said suspension rod;

a magnet disposed in a lower portion of said slider;

a slide plate on which said slider slides; and two magnetic elements, positioned such that said slide plate is between said magnetic elements and said magnet, respectively mounted on perpendicularly intersecting axes for generating electromotive voltages based on a magnetic flux density from said magnet, wherein said electromotive voltages are changed by moving said magnet to reach a first position and a second position on opposite sides of said neutral position, thereby changing said electromotive voltages in accordance with the position of said magnet.

7. The switch of claim 6, wherein at least one of said magnetic elements is disposed apart from the neutral position of said magnet.

8. The switch of claim 6, wherein both of said magnetic elements are disposed so as to extend over the neutral position of said magnet.

9. A switch, comprising:

an operation part movable horizontally about a neutral position thereof;

a pair of slide blocks disposed below said operation part and respectively including mutually opposingly inclined tapered surfaces;

an energizing member mounted on a lower end of said operation part for biasing said operation part against said tapered surfaces of said slide blocks, said energizing member slidable on the tapered surfaces due to the horizontal movement of said operation part;

a slider, movable horizontally about a neutral position with the horizontal movement of said operation part;

a magnet held by said slider; and a magnetic element disposed adjacent to said magnet for generating an electromotive voltage corresponding to a magnetic flux density from said magnet;

wherein said electromotive voltage is changed by moving said magnet to reach a first position and a second position on opposite sides of said neutral position, thereby changing said electromotive voltage in accordance with the position of said magnet.

10. The switch of claim 1, wherein said magnetic element is a proportion output type Hall IC.

11. The switch of claim 3, wherein said magnetic elements are proportion output type Hall ICs.

12. The switch of claim 3, wherein said magnetic elements are switch type Hall ICs.

13. The switch of claim 6, wherein said magnetic elements are proportion output type Hall ICs.

14. The switch of claim 9, wherein said magnetic element is a proportion output type Hall IC.

* * * * *